US007738049B2

(12) United States Patent
Chen

(10) Patent No.: US 7,738,049 B2
(45) Date of Patent: Jun. 15, 2010

(54) ACTIVE DEVICE ARRAY SUBSTRATE, ELECTRO-OPTICAL APPARATUS AND METHOD FOR FABRICATING THE SAME

(75) Inventor: Yu-Cheng Chen, Hsinchu (TW)

(73) Assignee: Au Optronics Corporation, Hsinchu (TW)

( * ) Notice: Subject to any disclaimer, the term of this patent is extended or adjusted under 35 U.S.C. 154(b) by 68 days.

(21) Appl. No.: 12/121,772

(22) Filed: May 15, 2008

(65) Prior Publication Data
US 2009/0213309 A1    Aug. 27, 2009

(30) Foreign Application Priority Data
Feb. 22, 2008    (TW) ............... 97106240 A

(51) Int. Cl.
*G02F 1/136* (2006.01)
(52) U.S. Cl. .......................................... 349/43; 349/38
(58) Field of Classification Search ............... 349/43
See application file for complete search history.

(56) References Cited
U.S. PATENT DOCUMENTS

| 6,278,502 | B1 * | 8/2001 | Colgan et al. ............... 349/38 |
| 6,348,367 | B1 | 2/2002 | Ohtani et al. |
| 7,023,508 | B2 * | 4/2006 | You ............... 349/113 |
| 2005/0140869 | A1 * | 6/2005 | Yang et al. ............... 349/114 |
| 2005/0230703 | A1 * | 10/2005 | Gu et al. ............... 257/112 |
| 2006/0055861 | A1 | 3/2006 | Hirota |
| 2006/0205126 | A1 * | 9/2006 | Yen ............... 438/163 |
| 2006/0209223 | A1 * | 9/2006 | Choi et al. ............... 349/43 |
| 2007/0032000 | A1 * | 2/2007 | Yeh et al. ............... 438/149 |

FOREIGN PATENT DOCUMENTS

| CN | 1637548 | 7/2005 |
| JP | 2005196157 | 7/2005 |

OTHER PUBLICATIONS

"1st Office Action of China counterpart application", issued on Sep. 11, 2009, p. 1-p. 6.

* cited by examiner

*Primary Examiner*—Frank G Font
*Assistant Examiner*—Eric Wong
(74) *Attorney, Agent, or Firm*—Jianq Chyun IP Office

(57) ABSTRACT

An active device array substrate including a substrate, a plurality of semiconductor patterns, a gate insulator layer, a first patterned conductive layer, a dielectric layer, a plurality of transparent electrodes, a passivation layer, and a second patterned conductive layer is provided. The semiconductor patterns are disposed on the substrate. The gate insulator layer is disposed on the substrate to cover the semiconductor patterns. The first patterned conductive layer disposed on the gate insulator layer includes a plurality of scan lines, a plurality of gate electrodes disposed on each semiconductor pattern and connected with the scan lines, and a plurality of common electrodes disposed between the scan lines. The dielectric layer is disposed on the gate insulator layer to cover the first patterned conductive layer. The transparent electrodes are disposed on the dielectric layer. The passivation layer is disposed on parts of the dielectric layer to expose the transparent electrodes.

34 Claims, 18 Drawing Sheets

ACTIVE DEVICE ARRAY SUBSTRATE, ELECTRO-OPTICAL APPARATUS AND METHOD FOR FABRICATING THE SAME

CROSS-REFERENCE TO RELATED APPLICATION

This application claims the priority benefit of Taiwan application serial no. 97106240, filed on Feb. 22, 2008. The entirety of the above-mentioned patent application is hereby incorporated by reference herein and made a part of specification.

BACKGROUND OF THE INVENTION

1. Field of the Invention

The present invention relates to a display panel and a method for fabricating the same and, more particularly, relates to an active device array substrate and a method for fabricating the same.

2. Description of Related Art

Along with the widespread use of liquid crystal displays (LCD), requirements for better display performance of LCDs in many electronic products are gradually increased. For example, liquid crystal displays are required not only to provide satisfactory display effect indoors, but also to maintain favorable image quality in bright light environment. Hence, how to maintain sharp display quality of liquid crystal displays in bright light environment has become one of the major trends in LCD development. Based on the above reasons, a transflective LCD has been provided. Generally speaking, a transflective LCD mainly consists of an active device array substrate, a color filter substrate, and a liquid crystal layer.

A transflective LCD displays images by simultaneously using a back light source and an external light source. Furthermore, a pixel unit of the active device array substrate is divided into a transparent region and a reflective region. A transparent electrode disposed on the transparent region allows the back light source to pass through, and a reflective electrode disposed on the reflective region is adapted to reflecting the external light source.

More specifically, the processes for fabricating the active device array substrate in a conventional transflective LCD are usually more complicated in order to achieve better display quality. The times of performing photolithography and etching processes directly influence the costs and time consumed in fabricating the whole active device array substrate. Hence, manufacturers in this field all try to develop a fabricating method which requires fewer times of photolithography and etching processes. To increase throughput and reduce production costs, it is necessary to improve the conventional processes for fabricating the active device array substrates of transflective LCDs.

SUMMARY OF THE INVENTION

The present invention provides an active device array substrate which has a stray capacitance with reduced cross line areas and a better storage capacitance value.

The present invention also provides a method for fabricating an active device array substrate, which has simple fabricating processes and reduces production time and costs.

The present invention further provides an electro-optical apparatus, which has the aforesaid active device array substrate and provides better display quality.

The present invention further provides a method for fabricating the aforesaid electro-optical apparatus.

The present invention provides an active device array substrate including a substrate, a plurality of semiconductor patterns, a gate insulator layer, a first patterned conductive layer, a dielectric layer, a plurality of transparent electrodes, a passivation layer, and a second patterned conductive layer. The semiconductor patterns are disposed on the substrate. The gate insulator layer is disposed on the substrate to cover the semiconductor patterns. The first patterned conductive layer is disposed on the gate insulator layer and comprises a plurality of scan lines, a plurality of gate electrodes disposed on each of the semiconductor patterns and connected with the scan lines, and a plurality of common electrodes disposed between the scan lines. The dielectric layer is disposed on the gate insulator layer to cover the first patterned conductive layer. The transparent electrodes are disposed on the dielectric layer. The passivation layer is disposed on parts of the dielectric layer so as to expose the transparent electrodes. The gate insulator layer, the dielectric layer, and the passivation layer have a plurality of contact windows to expose parts of the semiconductor patterns. The second patterned conductive layer is disposed on the passivation layer, wherein the second patterned conductive layer comprises a plurality of contact conductors disposed in the contact windows, a plurality of data lines electrically connected with parts of the contact conductors, and a plurality of reflective electrodes electrically connected with corresponding transparent electrodes respectively, and a portion of the common electrodes is disposed under the second patterned conductive layer.

The present invention further provides a method for fabricating an active device array substrate. First, a plurality of semiconductor material layers is formed on a substrate. Next, a gate insulator layer is formed on the substrate to cover the semiconductor material layers. Then, a first patterned conductive layer is formed on the gate insulator layer, wherein the first patterned conductive layer comprises a plurality of scan lines, a plurality of gate electrodes disposed on each of the semiconductor material layers and connected with the scan lines, and a plurality of common electrodes disposed between the scan lines. Thereafter, an ion doping process is performed on the semiconductor material layers to form at least a channel region and at least a doped region disposed at two sides of the channel region in the semiconductor material layers. Following that, a dielectric layer is formed on the gate insulator layer to cover the first patterned conductive layer. Then, a plurality of transparent electrodes is formed on the dielectric layer. Next, a passivation layer is formed on parts of the dielectric layer so as to expose the transparent electrodes, wherein the gate insulator layer, the dielectric layer, and the passivation layer comprise a plurality of contact windows to expose the semiconductor patterns. Thereafter, a second patterned conductive layer is formed on the passivation layer, wherein the second patterned conductive layer comprises a plurality of contact conductors disposed in the contact windows, a plurality of data lines electrically connected with parts of the contact conductors, and a plurality of reflective electrodes electrically connected with corresponding transparent electrodes respectively, and a portion of the common electrodes is disposed under the second patterned conductive layer.

The present invention further provides an electro-optical apparatus, comprising the aforesaid active device array substrate.

The present invention further provides a method for fabricating an electro-optical apparatus, comprising the aforesaid fabricating method of the active device array substrate.

To sum up, the active device array substrate of the present invention simplifies the conventional processes for fabricating active device array substrates. In addition, the dielectric layer and the passivation layer are disposed between the first patterned conductive layer and the second patterned conductive layer. Thereby, crosstalk between a portion of the common electrodes and at least one of the data lines and the scan lines is reduced when the active device array substrate is driven. Furthermore, the passivation layer is disposed between the transparent electrodes and the second patterned conductive layer. Consequently, crosstalk between the data lines and the transparent electrodes is reduced to decrease signal interference.

Hence, the active device array substrate of the present invention provides better display quality, has simpler fabricating processes, and requires lower production costs.

To make the above and other objectives, features and advantages of the present invention more comprehensible, preferred embodiments accompanied with figures are described in detail as follows.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain the principles of the invention.

FIGS. 2A-2L illustrate a process flow for fabricating an active device array substrate according to the present invention.

DESCRIPTION OF EMBODIMENTS

First Embodiment

Figure 1A:
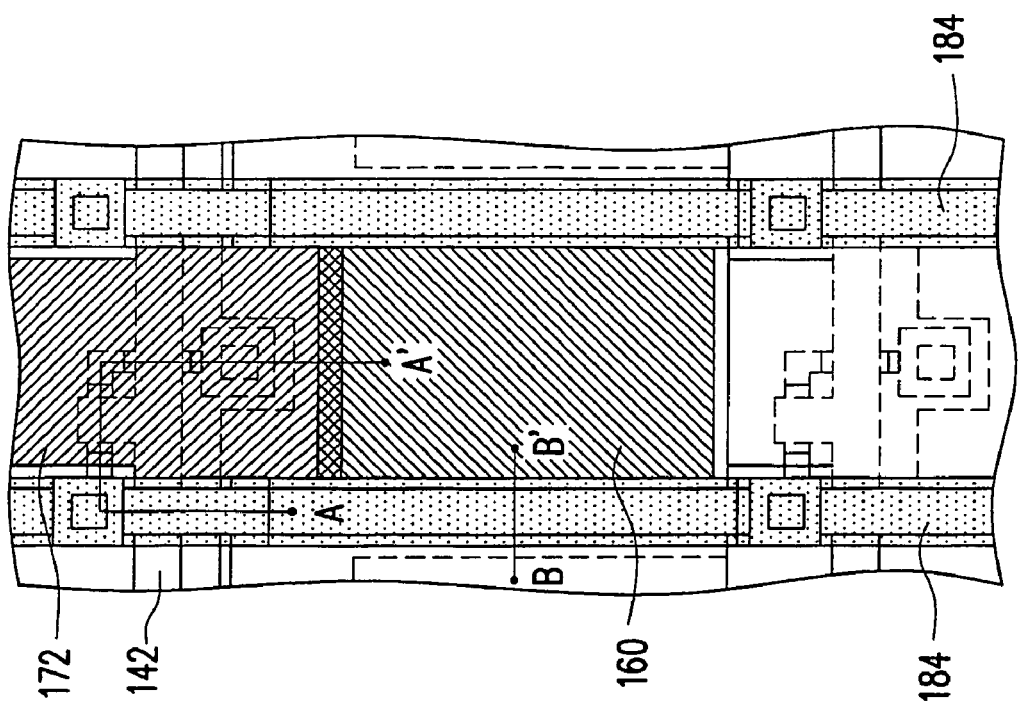
FIG. 1A is a schematic top view illustrating a portion of an active device array substrate according to the present invention.
Figure 1B:
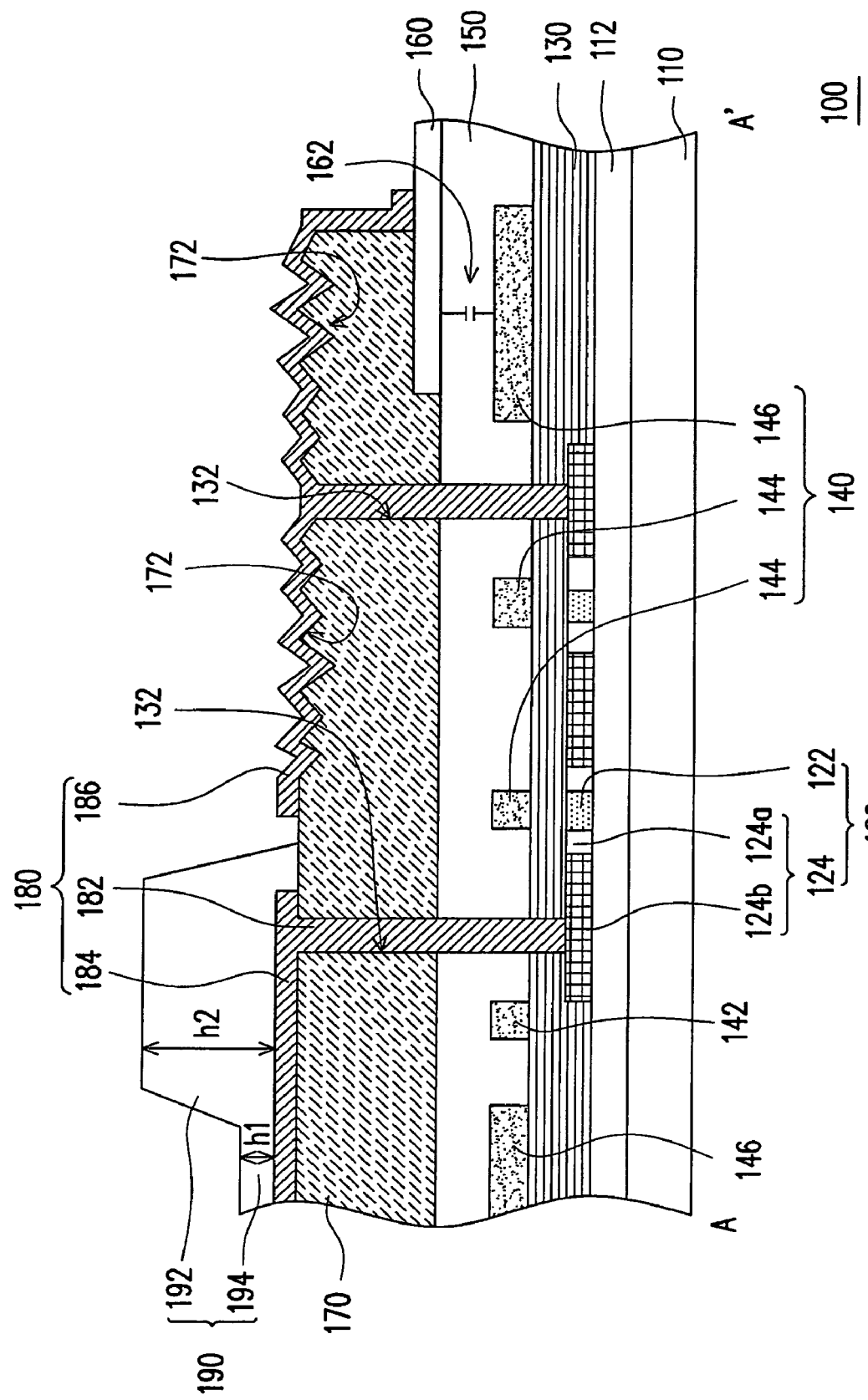
FIG. 1B is a schematic cross-sectional view illustrating a portion of an active device array substrate along the line AA' in FIG. 1A.
Figure 1C:
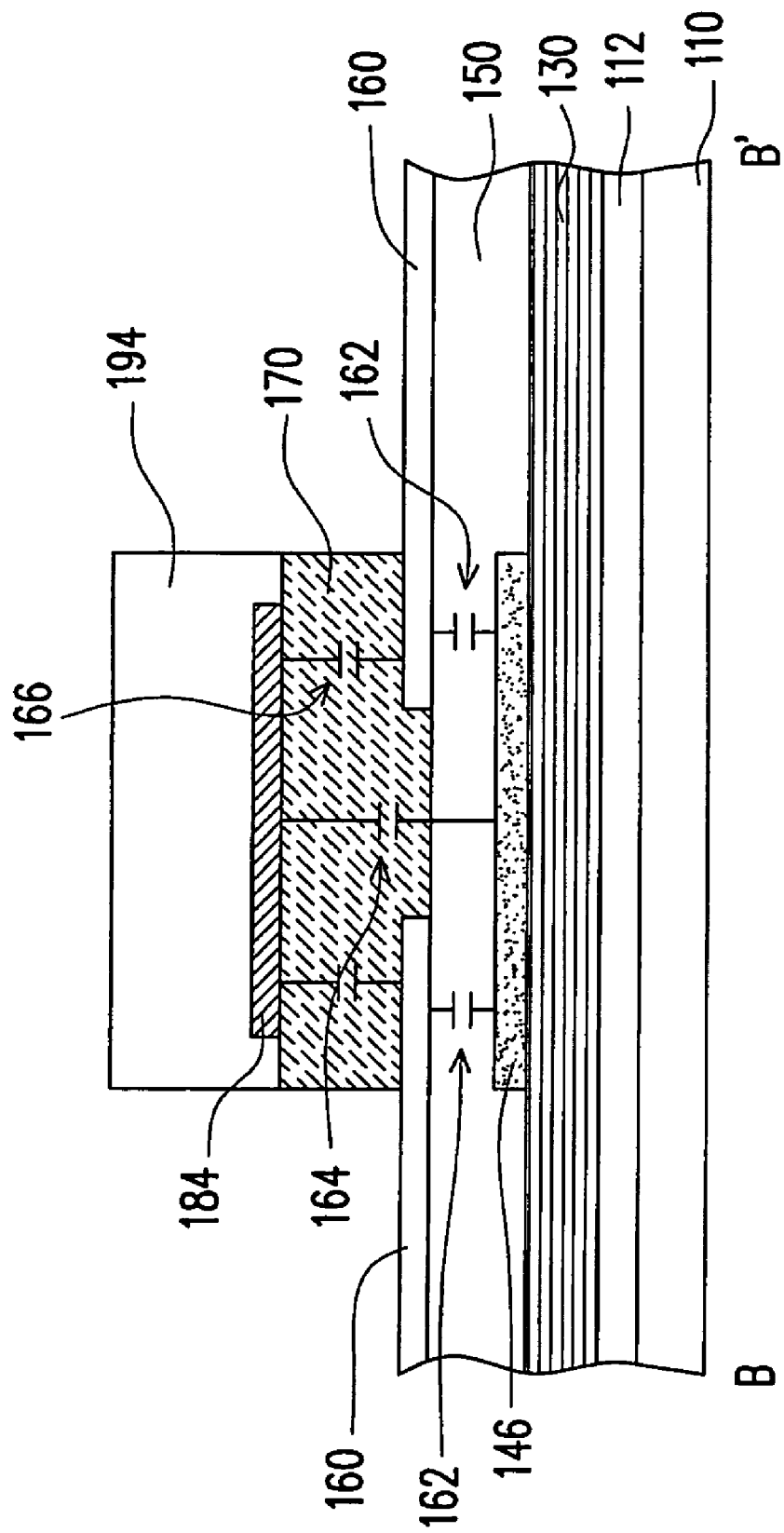
FIG. 1C is a schematic cross-sectional view illustrating a portion of an active device array substrate along the line BB' in FIG. 1A.

FIG. 1A is a schematic top view illustrating a portion of an active device array substrate according to the present invention. FIG. 1B is a schematic cross-sectional view illustrating a portion of an active device array substrate along the line AA' in FIG. 1A. FIG. 1C is a schematic cross-sectional view illustrating a portion of an active device array substrate along the line BB' in FIG. 1A. Referring to FIG. 1A and FIG. 1B, an active device array substrate 100 includes a substrate 110, a plurality of semiconductor patterns 120, a gate insulator layer 130, a first patterned conductive layer 140, a dielectric layer 150, a plurality of transparent electrodes 160, a passivation layer 170, and a second patterned conductive layer 180. Herein, the aforesaid layers are formed on the substrate 110 to form a plurality of pixel areas (not shown). In addition, the present invention is described based on one pixel area and a portion of neighboring pixel areas thereof.

Referring to FIG. 1B, the semiconductor patterns 120 are disposed on the substrate 110. In an embodiment of the present invention, the semiconductor patterns 120 comprise at least a channel region 122 and at least a doped region 124 disposed at two sides of the channel region 122. Furthermore, the doped region 124 comprises a lightly doped region 124a and a heavily doped region 124b. The lightly doped region 124a is connected between the heavily doped region 124b and the channel region 122. Generally speaking, a material of the channel region 122 may be poly-crystal silicon. A material of the lightly doped region 124a may be low-concentration P-type semiconductor material. A material of the heavily doped region 124b may be high-concentration P-type semiconductor material. The above is one of the examples, and the present invention is not limited thereto. In other words, a material of the lightly doped region 124a may also be low-concentration N-type semiconductor material, and a material of the heavily doped region 124b may also be high-concentration N-type semiconductor material. Moreover, in other embodiments, the lightly doped region 124a and the heavily doped region 124b are symmetrically arranged at two sides of the channel region, or the lightly doped region 124a is asymmetrically arranged at two sides of the channel region and the heavily doped region 124b is symmetrically arranged at two sides of the channel region. The present invention does not limit the kinds of semiconductor materials to be used. Hence, semiconductor materials, such as amorphous silicon, monosilicon, micro-silicon, silicon germanium of the above lattices, other suitable materials, or a combination of the above, may be applied according to the user's designs and requirements. In addition, a material of the substrate 110 comprises an inorganic transparent material (e.g. glass, quartz, other suitable materials, or a combination thereof), an organic transparent material (e.g. polyolefne, polythiourea, polyalcohols, polyester, rubber, a thermoplastic polymer, a thermosetting polymer, polyarylene, polymethylmethacrylate, polycarbonate, other suitable materials, derivatives thereof, or a combination thereof), an inorganic opaque material (e.g. silicon, ceramics, other suitable materials, or a combination thereof), or a combination of the above. For example, the substrate 110 serves as a base in a pixel array substrate. Glass, one of the inorganic transparent materials, is taken as an example in the embodiment, but the present invention is not limited thereto.

The gate insulator layer 130 is disposed on the substrate 110 to cover the semiconductor patterns 120. Moreover, the first patterned conductive layer 140 is disposed on the gate insulator layer 130, and the first patterned conductive layer 140 comprises a plurality of scan lines 142, a plurality of gate electrodes 144 disposed on the semiconductor patterns 120 and connected with the scan lines 142, and a plurality of common electrodes 146 disposed between the scan lines 142. Generally speaking, the gate insulator layer 130 may be a single-layer structure or a multi-layer structure. A material of the gate insulator layer 130 is, for example, an inorganic material (e.g. silicon oxide, silicon nitride, silicon oxynitride, silicon carbide, hafnium oxide, aluminum oxide, other materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. Silicon oxide ($SiO_2$) or Silicon nitride ($SiN_x$) is taken as an example in the embodiment. However, the present invention is not limited thereto. The first patterned conductive layer 140 is a single-layer structure or a multi-layer structure. A material of the first patterned conductive layer 140 is, for example, gold, silver, copper, tin, lead, hafnium, tungsten, molybdenum, neodymium, titanium, tantalum, aluminum, zinc, alloys of the above, metal oxides of the above, metal nitrides of the above, or a combination of the above. A lamination of molybdenum and aluminum is taken as an example in the embodiment. However, the present invention is not limited thereto.

In addition, the dielectric layer 150 is disposed on the gate insulator layer 130 to cover the first patterned conductive layer 140, and the transparent electrodes 160 are disposed on the dielectric layer 150. In an embodiment of the present invention, the dielectric layer 150 may be a single-layer structure or a multi-layer structure. A material of the dielectric layer 150 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, BCB, cycloolefin, polyimide, polyamide, polyester, polyalcohols, polyethylene, polyphenylene, resin, polyether, polyketone, other suitable materials, or a combination thereof), or a combination of the above. Silicon nitride is taken as an example in the embodiment. However, the present invention is not limited thereto. Furthermore, the transparent electrodes 160 may be single-layer structures or multi-layer structures. A material of the transparent electrodes 160 is, for example, indium tin oxide (ITO), indium zinc oxide (IZO), indium tin zinc oxide (ITZO), hafnium oxide, zinc oxide, aluminum oxide, aluminum tin oxide (ATO), aluminum zinc oxide (AZO), cadmium tin oxide (CTO), cadmium zinc oxide (CZO), other suitable materials, or a combination of the above.

In addition, the passivation layer 170 is disposed on parts of the dielectric layer 150 and exposes the transparent electrodes 160. The gate insulator layer 130, the dielectric layer 150, and the passivation layer 170 have a plurality of contact windows 132 to expose the semiconductor patterns 120. In an embodiment of the present invention, the passivation layer 170 may be a single-layer structure or a multi-layer structure. A material of the passivation layer 170 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, BCB, cycloolefin, polyimide, polyamide, polyester, polyalcohols, polyethylene, polyphenylene, resin, polyether, polyketone, other suitable materials, or a combination thereof), or a combination of the above. The passivation layer 170 is formed by an organic material, photoresist, is taken as an example in this embodiment, and the passivation layer 170 is also called a planar layer. However, the present invention is not limited thereto. Moreover, in an embodiment, the passivation layer 170 does not have a plurality of bumpy regions 172 (or rough and uneven regions), i.e. a surface of the passivation layer 170 is an even surface. In another embodiment, the passivation layer 170 has a plurality of bumpy regions 172, i.e. the surface of the passivation layer 170 has the bumpy regions 172 or a portion of the passivation layer 170 has the bumpy regions 172. Moreover, in this embodiment, preferably a portion of the passivation layer 170 has the bumpy regions 172 is taken as an example. However, the present invention is not limited thereto.

Referring to FIG. 1B, the second patterned conductive layer 180 is disposed on the passivation layer 170. The second patterned conductive layer 180 comprises a plurality of contact conductors 182 disposed in the contact windows 132, a plurality of data lines 184 electrically connected with parts of the contact conductors 182, and a plurality of reflective electrodes 186 electrically connected with corresponding transparent electrodes 160 respectively, wherein a portion of the common electrodes 146 is disposed under the second patterned conductive layer 180. In an embodiment of the present invention, the passivation layer 170, for example, does not have the bumpy regions 172, i.e. the surface of the passivation layer 170 is an even surface, and each of the reflective electrodes 186 disposed on the passivation layer 170 extends above corresponding transparent electrodes 160 so as to overlap a portion of corresponding transparent electrodes 160. In other words, the reflective electrodes 186 are electrically connected with the transparent electrodes 160. In another embodiment, a portion of the passivation layer 170, for example, has the bumpy regions 172, and each of the reflective electrodes 186 is not only disposed on the bumpy regions 172 but also extends above corresponding transparent electrodes 160 from the bumpy regions 172 so as to overlap a portion of corresponding transparent electrodes 160. In addition, the second patterned conductive layer 180 is a single-layer structure or a multi-layer structure. A material of the second patterned conductive layer 180 is, for example, gold, silver, copper, tin, lead, hafnium, tungsten, molybdenum, neodymium, titanium, tantalum, aluminum, zinc, alloys of the above, metal oxides of the above, metal nitrides of the above, or a combination of the above. A lamination of molybdenum and aluminum is taken as an example in this embodiment. However, the present invention is not limited thereto.

It is noted that the active device array substrate 100 further includes a plurality of material pattern layers 190. The material pattern layers 190 are disposed on at least one of a portion of the second patterned conductive layer 180 and a portion of the passivation layer 170. Each of the material pattern layers 190 has at least one of at least a holder 192 and at least a protective section 194. Preferably, each of the material pattern layers 190 has at least a holding section 192 and at least a protective section 194, wherein a thickness h1 of the holding section 192 is substantially greater than a thickness h2 of the protective section 194. To be more specific, take the assembly of a display panel (not shown) as an example, if the material pattern layers 190 simultaneously has at least a holding section 192 and at least a protective section 194, the holding section 192 is used to maintain a gap between the active device array substrate 100 and a corresponding opposite substrate (not shown), and the holding section 192 is also called a spacer. The protective section 194 is used to protect a portion of the second patterned conductive layer 180 disposed on the active device array substrate 100, such as the data lines 184, so as to prevent the second patterned conductive layer 180 from being eroded and/or scratched. In other words, the material pattern layers 190 are, for example, disposed on a portion of the data lines 184. The material pattern layers 190 may be single-layer structures or multi-layer structures. A material of the material pattern layers 190 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, BCB, cycloolefin, polyimide, polyamide, polyester, polyalcohols, polyethylene, polyphenylene, resin, polyether, polyketone, other suitable materials, or a combination thereof), or a combination of the above. An organic photosensitive material, photoresist, is taken as an example in this embodiment. However, the present invention is not limited thereto. Certainly, the active device array substrate 100 may not includes the material pattern layers 190.

In addition, the active device array substrate 100 further includes a buffer layer 112. The buffer layer 112 is disposed on the substrate 110 and is disposed between the substrate 110 and the semiconductor patterns 120. Herein, the buffer layer 112 prevents impurities in the substrate 110 infiltrating into the semiconductor patterns 120 when the semiconductor patterns 120 are formed, so as to prevent influencing the electric property of the active device array substrate 100 when the active device array substrate 100 is driven. The buffer layer 112 of the present invention may be a single-layer structure or a multi-layer structure. A material of the buffer layer 112 is, for example, an inorganic material (e.g. silicon oxide, silicon nitride, silicon oxynitride, silicon carbide, hafnium oxide, aluminum oxide, other materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. An inorganic material, silicon nitride, is taken as an example in this embodiment. However, the present invention is not limited thereto. Certainly, if a concentration of the impurities in the substrate 110 is properly controlled or the impurities do not exist in the substrate 110, the buffer layer 112 is not required.

In an embodiment of the present invention, the transparent electrodes 160 extend above one of the common electrodes 146 to couple with corresponding common electrodes 146 and form at least a capacitor 162, which is also called a pixel capacitor.

In addition, referring to FIG. 1A and FIG. 1C, FIG. 1C is a schematic cross-sectional view illustrating a portion of an active device array substrate along the line BB' in FIG. 1A. Referring to the schematic top view, in an embodiment, the data lines 184 are disposed between two neighboring pixel areas (not shown) which have horizontal sides upward or vertical sides upward. The data lines 184 and the passivation layer 170 cover a portion of the transparent electrodes 160 at two sides of the data lines 184, and the common electrodes 146 are disposed under the data lines 184 and the portion of the transparent electrodes 160, as shown in FIG. 1C. It is noted that the portion of the transparent electrodes 160 at two sides of the data lines 184 are disposed in different pixel areas, and two transparent electrodes 160 are electrically insulated. In another embodiment, the data lines 184 are disposed in a pixel area (not shown). The data lines 184 and the passivation layer 170 cover a portion of the transparent electrodes 160 at two sides of the data lines 184, and the common electrodes 146 are disposed under the data lines 184 and the portion of the transparent electrodes 160. It is noted that the portion of the transparent electrodes 160 at two sides of the data lines 184 is disposed in one pixel area, and two transparent electrodes 160 may be electrically insulated or connected depending on the design requirements. Herein, when the active device array substrate 100 is driven, the transparent electrodes 160 are coupled with corresponding common electrodes 146 to form the aforesaid capacitor 162. In addition, the data lines 184 are coupled with corresponding common electrodes 146 to form another capacitor 164. Particularly, because the passivation layer 170 and the dielectric layer 150 are disposed between the data lines 184 and the common electrodes 146, a parasitic capacitance value of the capacitor 164 is so small that crosstalk between the data lines 184 and the common electrodes 146 is decreased to reduce the delay of signals. Furthermore, the passivation layer 170 may be disposed to cover the scan lines 142 so that the passivation layer 170 and the dielectric layer 150 are disposed between the scan lines 142 and the second patterned conductive layer (e.g. reflective electrodes). Consequently, the parasitic capacitance value of the capacitor 164 is so small that crosstalk between the scan lines 142 and the second patterned conductive layer is decreased to reduce the delay of signals. In addition, the data lines 184 are also coupled with the transparent electrodes 160 underneath to form another capacitor 166. Because the passivation layer 170 is disposed between the data lines 184 and the transparent electrodes 160, a parasitic capacitance value of the capacitor 166 is so small that crosstalk between the data lines 184 and the transparent electrodes 160 is decreased to reduce signal interference. In other words, a structure, which comprises the data lines 184, the passivation layer 170, the transparent electrodes 160, the dielectric layer 150, and the common electrodes 146 from top to bottom, has an effect of reducing crosstalk. Furthermore, the pixel capacitor 162 formed by the common electrodes 146 and a portion of the transparent electrodes 160 is disposed under the data lines 184. Consequently, the area used is reduced and an aperture ratio of the active device array substrate 100 is increased to enhance the display quality.

Figure 1D:
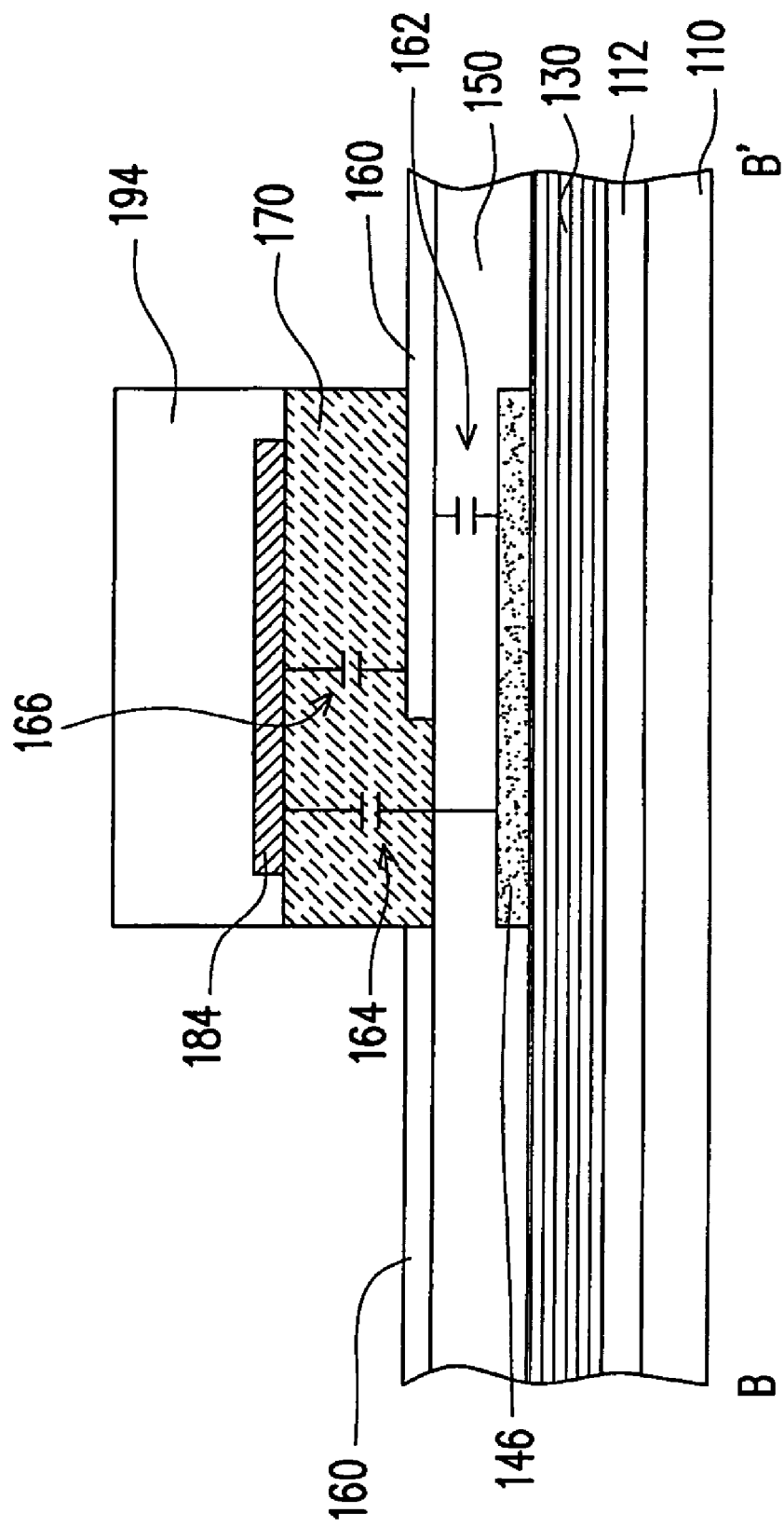
FIG. 1D is a schematic cross-sectional view illustrating a portion of an active device array substrate along the line BB' in FIG. 1A.

Then, referring to FIG. 1A and FIG. 1D, FIG. 1D is a schematic cross-sectional view illustrating a portion of an active device array substrate along the line BB' in FIG. 1A. In another embodiment, the passivation layer 170 may cover a portion of the transparent electrodes 160 at one side of the data lines 184, and the common electrodes 146 are disposed under the portion of the transparent electrodes 160 to form capacitors 162, 164, and 166, as shown in FIG. 1D.

Figure 1E:
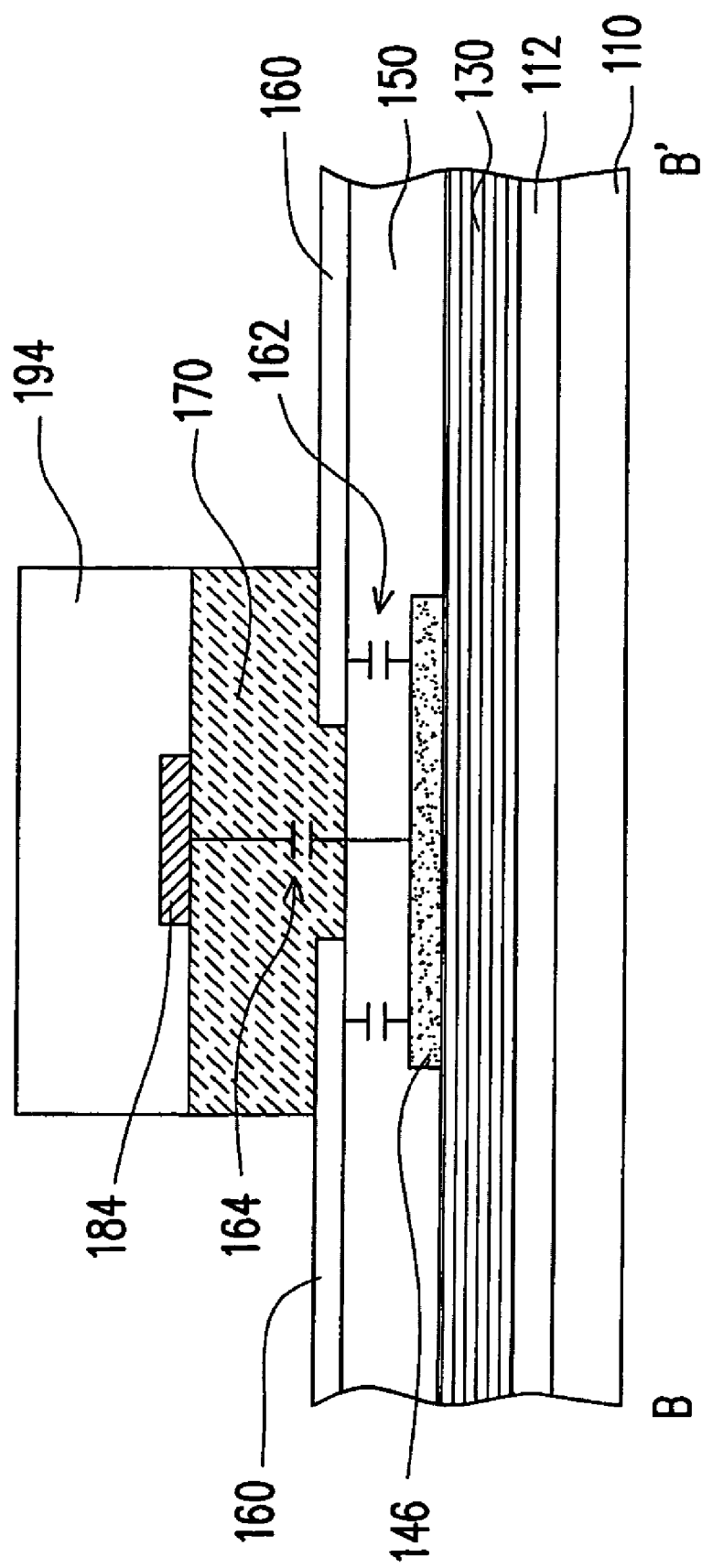
FIG. 1E is a schematic cross-sectional view illustrating a portion of an active device array substrate along the line BB' in FIG. 1A.

Next, referring to FIG. 1A and FIG. 1E, FIG. 1E is a schematic cross-sectional view illustrating a portion of an active device array substrate along the line BB' in FIG. 1A. In yet another embodiment, the data lines 184 are disposed on the passivation layer 170 without covering the transparent electrodes 160. The passivation layer 170 covers a portion of the transparent electrodes 160 at two sides of the data lines 184, and the common electrodes 146 are disposed under the data lines 184 and the portion of the transparent electrodes 160 to form the capacitors 162 and 164, as shown in FIG. 1E. Herein, at least a capacitor 162 is formed. Two capacitors 162 are taken as an example in the present invention.

Figure 2A:
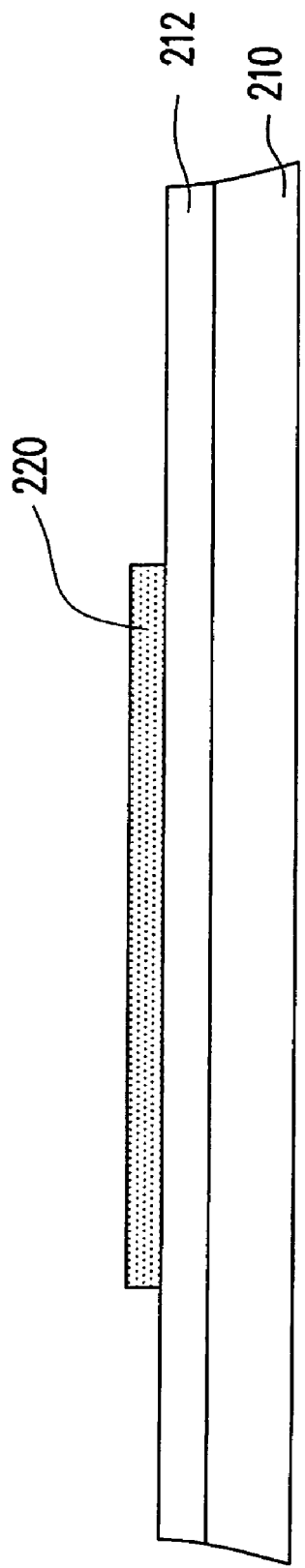

In addition, FIG. 2A~FIG. 2L illustrate a process flow for fabricating an active device array substrate according to the present invention. First, referring to FIG. 2A, a plurality of semiconductor material layers 220 is formed on a substrate 210. Herein, a method for forming the semiconductor material layers 220 is, for example, a conventional photolithography and etching process (PEP). For instance, a semiconductor material layer (not shown) is formed all over the substrate 210. Then, the photolithography and etching process is performed to pattern the semiconductor material layer into a plurality of semiconductor material layers 220, as shown in FIG. 2A. However, the present invention is not limited thereto. Other suitable methods, such as screen printing, coating, inkjet, and energy source processing, may also be used. In this embodiment, a material of the semiconductor material layers 220 may be amorphous silicon, mono-silicon, micro-silicon, poly-crystal silicon, silicon germanium of the above lattices, other suitable materials, or a combination of the above poly-crystal silicon is taken as an example in the embodiment. However, the present invention is not limited thereto. A material of the substrate 210 comprises an inorganic transparent material (e.g. glass, quartz, other suitable materials, or a combination thereof), an organic transparent material (e.g. polyolefne, polythiourea, polyalcohols, polyester, rubber, a thermoplastic polymer, a thermosetting polymer, polyarylene, polymethylmethacrylate, polycarbonate, other suitable materials, derivatives of the above, or a combination thereof), an inorganic opaque material (e.g. silicon, ceramics, other suitable materials, or a combination thereof), or a combination of the above. An inorganic transparent material, glass, is taken as an example in this embodiment. However, the present invention is not limited thereto.

In this embodiment, it is noted that a buffer layer 212 may be formed before the aforesaid semiconductor material layers 220 are formed, as shown in FIG. 1A. Herein, the buffer layer 212 is adapted for preventing impurities in the substrate 210 infiltrating into the semiconductor material layers 220 and contaminating the semiconductor material layers 220 when the semiconductor material layers 220 are formed. Certainly, if a concentration of the impurities in the substrate 210 is properly controlled, the buffer layer 212 is not required. The buffer layer 212 may be a single-layer structure or a multi-layer structure. A material of the buffer layer 212 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. An inorganic material, silicon nitride, is taken as an example in this embodiment. However, the present invention is not limited thereto. A method for forming the gate insulator layer 230 is, for example, chemical vapor deposition (CVD). However, the present invention is not limited thereto. Other suitable methods, such as screen printing, coating, inkjet, and energy source processing, may also be applied in forming the gate insulator layer 230.

Figure 2B:
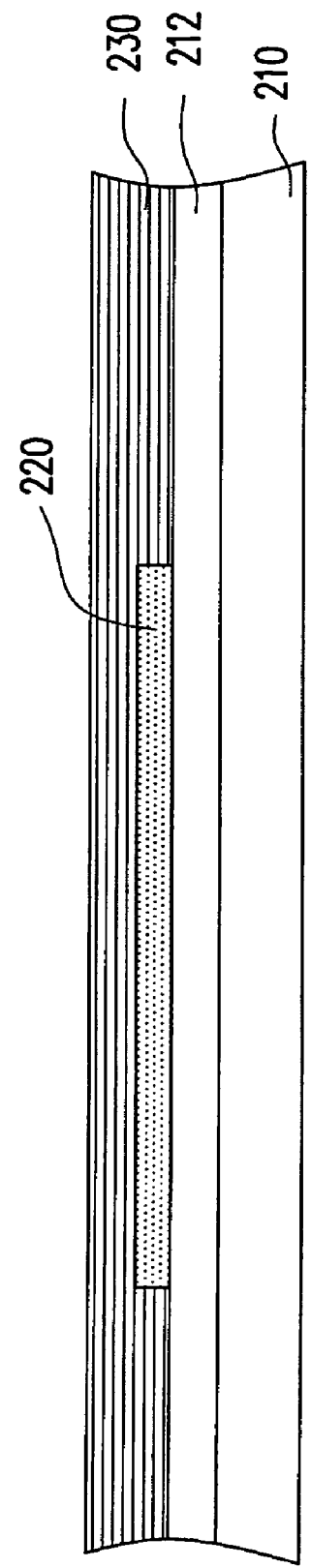

Next, referring to FIG. 2B, a gate insulator layer 230 is formed on the substrate 210 to cover the semiconductor material layers 220. A method for forming the gate insulator layer 230 is, for example, chemical vapor deposition (CVD), as shown in FIG. 2B. However, the present invention is not limited thereto. Other suitable methods, such as screen printing, coating, inkjet, and energy source processing, may also be applied in forming the gate insulator layer 230. The gate insulator layer 230 may be a single-layer structure or a multi-layer structure. A material of the gate insulator layer 230 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. Silicon oxide ($SiO_2$) or Silicon nitride ($SiN_x$) is taken as an example in this embodiment. However, the present invention is not limited thereto.

Figure 2C:
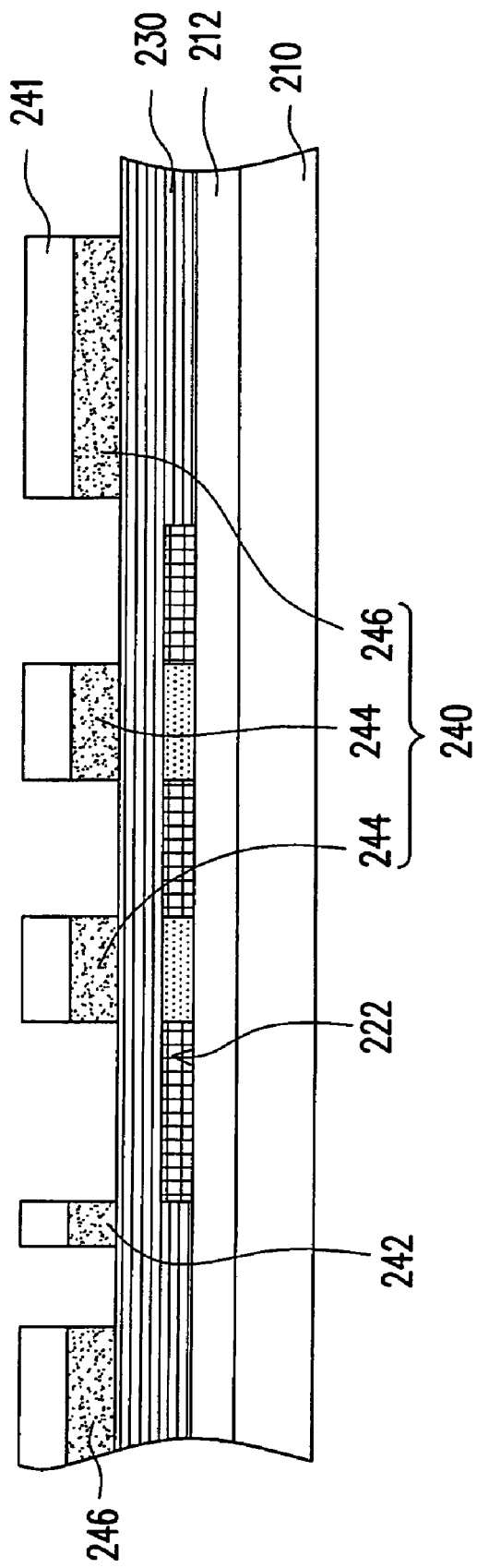

Then, referring to FIG. 2C, a first patterned conductive layer 240 is formed on the gate insulator layer 230. A method for forming the first patterned conductive layer 240 is, for example, a photolithography and etching process. For example, a metal material layer (not shown) is formed all over the gate insulator layer 230 first. Then, the photolithography and etching process is performed to pattern the metal material layer into the first patterned conductive layer 240, as shown in FIG. 2C. In addition, the first patterned conductive layer 240 comprises a plurality of scan lines 242, a plurality of gate electrodes 244 disposed on the semiconductor material layers 220 and connected with the scan lines 242, and a plurality of common electrodes 246 disposed between the scan lines 242. It is noted that a photoresist layer 241 on the first patterned conductive layer 240 is not removed after the first patterned conductive layer 240 is formed.

Next, referring to FIG. 2C, the photoresist layer 241 is used as a mask to perform an ion doping process in the semiconductor material layers 220 so as to form at least a heavily doped region 222 in the semiconductor material layers 220. Herein, a method for forming the heavily doped region 222 is, for example, ion implantation. However, the present invention does not limit the method for forming the heavily doped region 222.

Figure 2D:
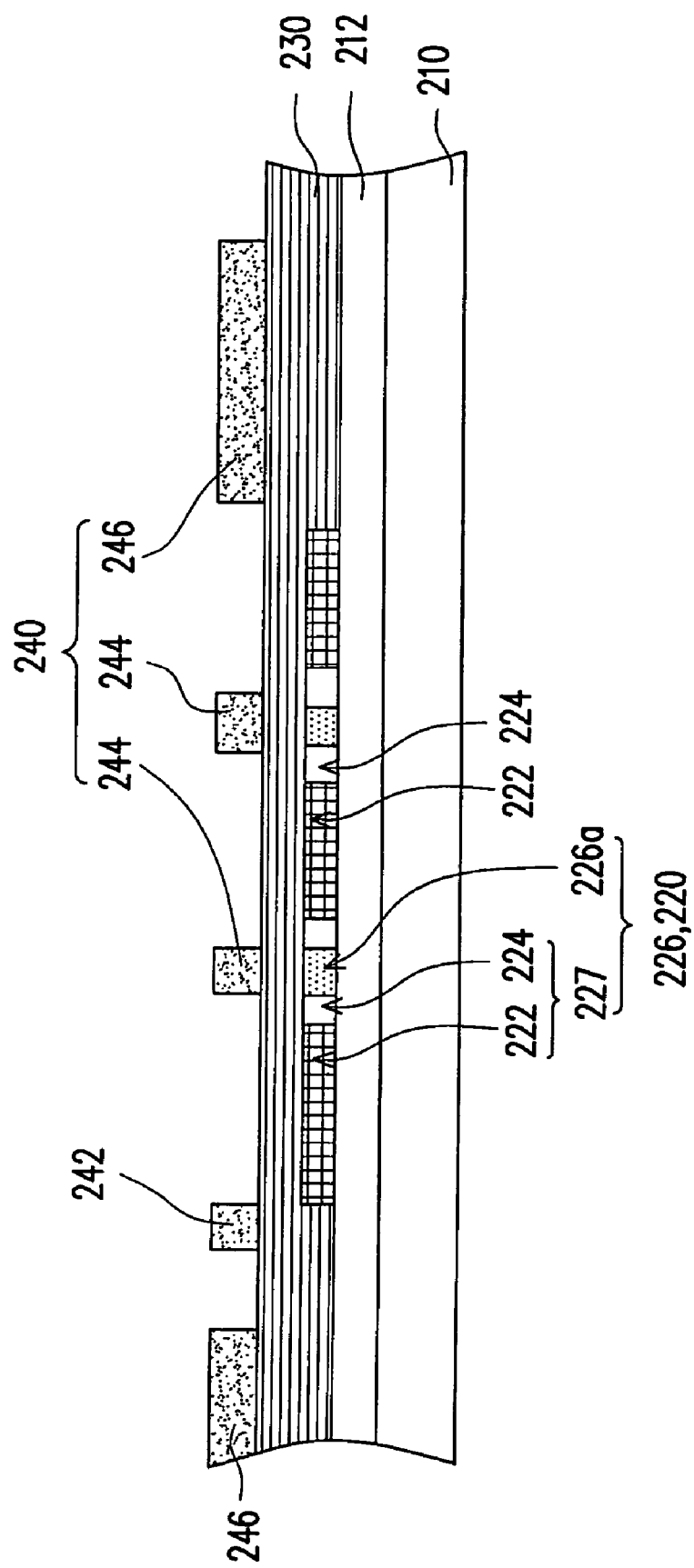

Thereafter, referring to FIG. 2D, a method of plasma ashing is performed to shrink a size of the photoresist layer 241 so as to expose a portion of the first patterned conductive layer 240 and remove a portion of the first patterned conductive layer 240 to expose a portion of the semiconductor material layer 220. Following that, the first patterned conductive layer 240 is used as a mask to perform an ion doping process in the semiconductor material layers 220 so as to form at least a lightly doped region 224, as shown in FIG. 2D. Because the aforesaid ion doping process is performed on the semiconductor material layer 220, a plurality of semiconductor patterns 226 is formed. In other words, the semiconductor patterns 226 comprise at least a channel region 226a and at least a doped region 227 disposed at two sides of the channel region 226, wherein the doped region 227 comprises the aforesaid heavily doped region 222 and lightly doped region 224. Moreover, in other embodiments, the lightly doped region 224 and the heavily doped region 222 are symmetrically arranged at two sides of the channel region, or the lightly doped region 224 is asymmetrically arranged at two sides of the channel region and the heavily doped region 222 is symmetrically arranged at two sides of the channel region. It is noted that the present invention is not limited to the method for forming the semiconductor patterns 226. In other embodiments, a new photoresist layer 241 having different thicknesses may be used to simultaneously form at least a lightly doped region 224 and at least a heavily doped region 222, or two new photoresist layers 241 having different patterns may be respectively used to form at least a lightly doped region 224 and at least a heavily doped region 222 after the semiconductor material layer 220 is formed. Alternatively, in other embodiments, a new photoresist layer 241 having different thicknesses may be used to simultaneously form at least a lightly doped region 224 and at least a heavily doped region 222, or two new photoresist layers 241 having different patterns may be respectively used to form at least a lightly doped region 224 and at least a heavily doped region 222 after the gate insulator layer 230 is formed. Alternatively, in other embodiments, the retaining new photoresist layer 241 may be removed, and then a new photoresist layer 241 or two new photoresist layers 241 having different patterns may be used to respectively form at least a lightly doped region 224 and at least a heavily doped region 222 after the gate electrodes 244 are formed. Herein, a photoresist layer shrinking process is preferable when the new photoresist layer 241 is used. Alternatively, a stepped gate insulator layer 230 is formed on a predetermined doped region or a taper-shaped gate insulator layer 230 is formed from the substrate, and then a doping process is performed to simultaneously form at least a lightly doped region 224 and at least a heavily doped region 222 after the gate electrodes 244 are formed in the gate insulator layer 230.

Figure 2E:
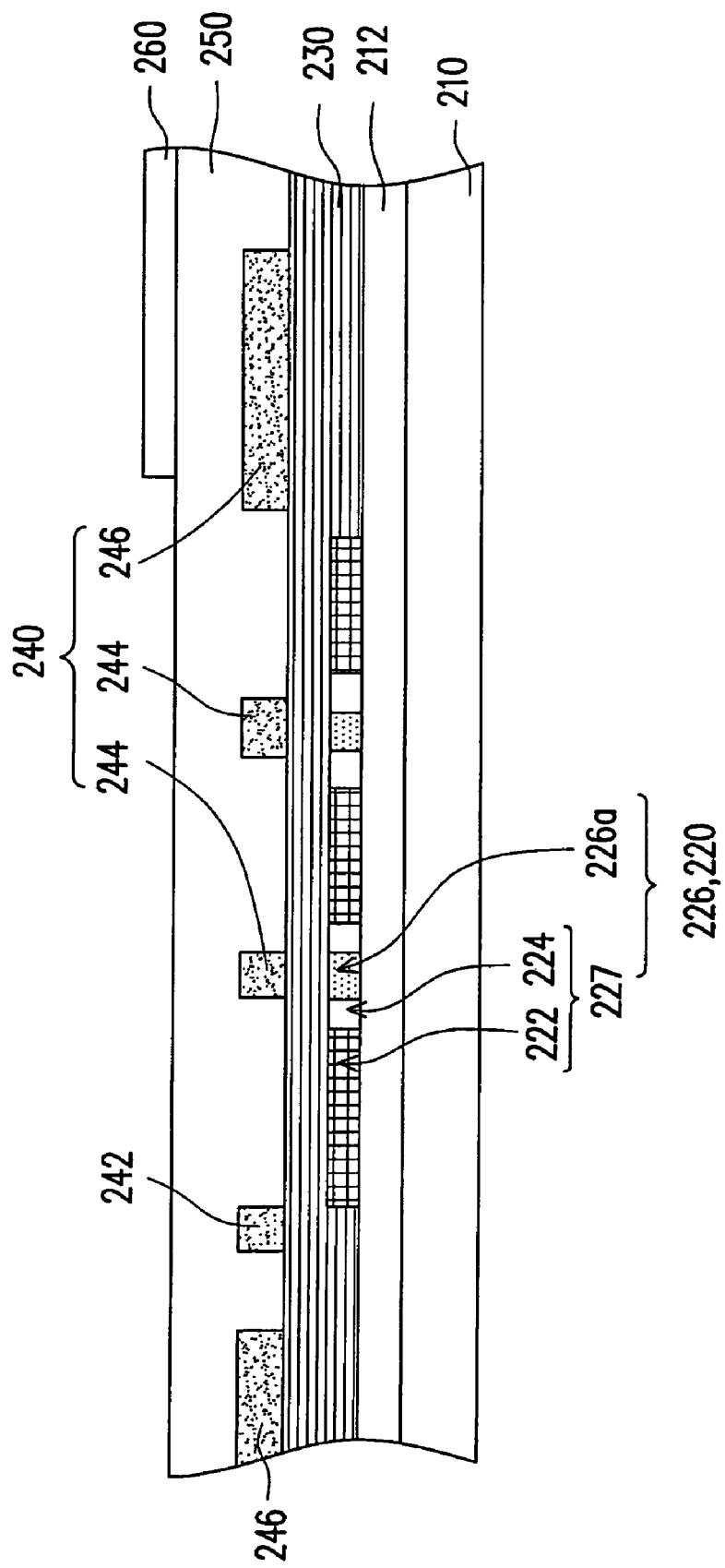

Thereafter, referring to FIG. 2E, a dielectric layer 250 is formed all over the gate insulator layer 230 to cover the first patterned conductive layer 240. A method for forming the dielectric layer 250 is, for example, chemical vapor deposition or other suitable methods, such as screen printing, coating, inkjet, or energy source processing. In an embodiment, a thickness of the dielectric layer 250 is, for example, substantially 1000 Å-2000 Å. In addition, the dielectric layer 250 may be a single-layer structure or a multi-layer structure. A material of the dielectric layer 250 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. Silicon nitride is taken as an example in this embodiment. However, the present invention is not limited thereto.

Referring to FIG. 2E, a plurality of transparent electrodes 260 is formed on the dielectric layer 250 on the substrate 210 after the aforesaid processes are completed. A method for forming the transparent electrodes 260 may be a photolithography and etching process. For example, a transparent electrode material layer (not shown) is formed all over the dielectric layer 250 first, wherein the transparent electrode material layer may be formed by sputtering or evaporation. Thereafter, a photolithography and etching process is performed to pattern the transparent electrode material layer so as to form transparent electrodes 260 in a certain area. Certainly, the aforesaid method for forming the transparent electrode material layer is merely one of the examples, and the present invention is not limited thereto. Other suitable methods, such as screen printing, coating, inkjet, and energy source processing, may also be applied in forming the transparent electrode material layer. The transparent electrodes 260 may be single-layer structures or multi-layer structures. A material of the transparent electrodes 260 is, for example, indium tin oxide (ITO), indium zinc oxide (IZO), indium tin zinc oxide (ITZO), hafnium oxide, zinc oxide, aluminum oxide, aluminum tin oxide (ATO), aluminum zinc oxide (AZO), cadmium tin oxide (CTO), cadmium zinc oxide (CZO), other suitable materials, or a combination of the above.

Figure 2F:
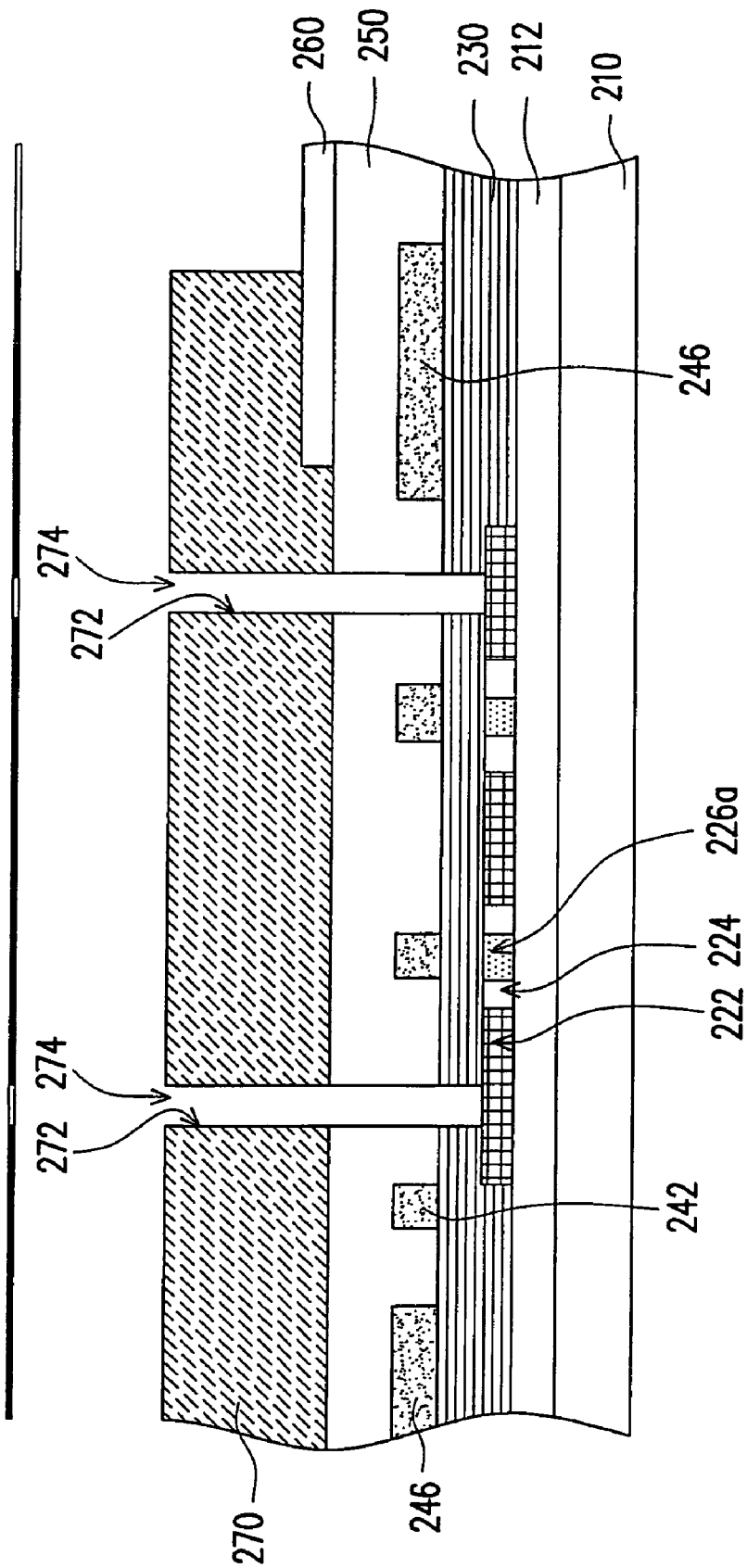
Figure 2G:
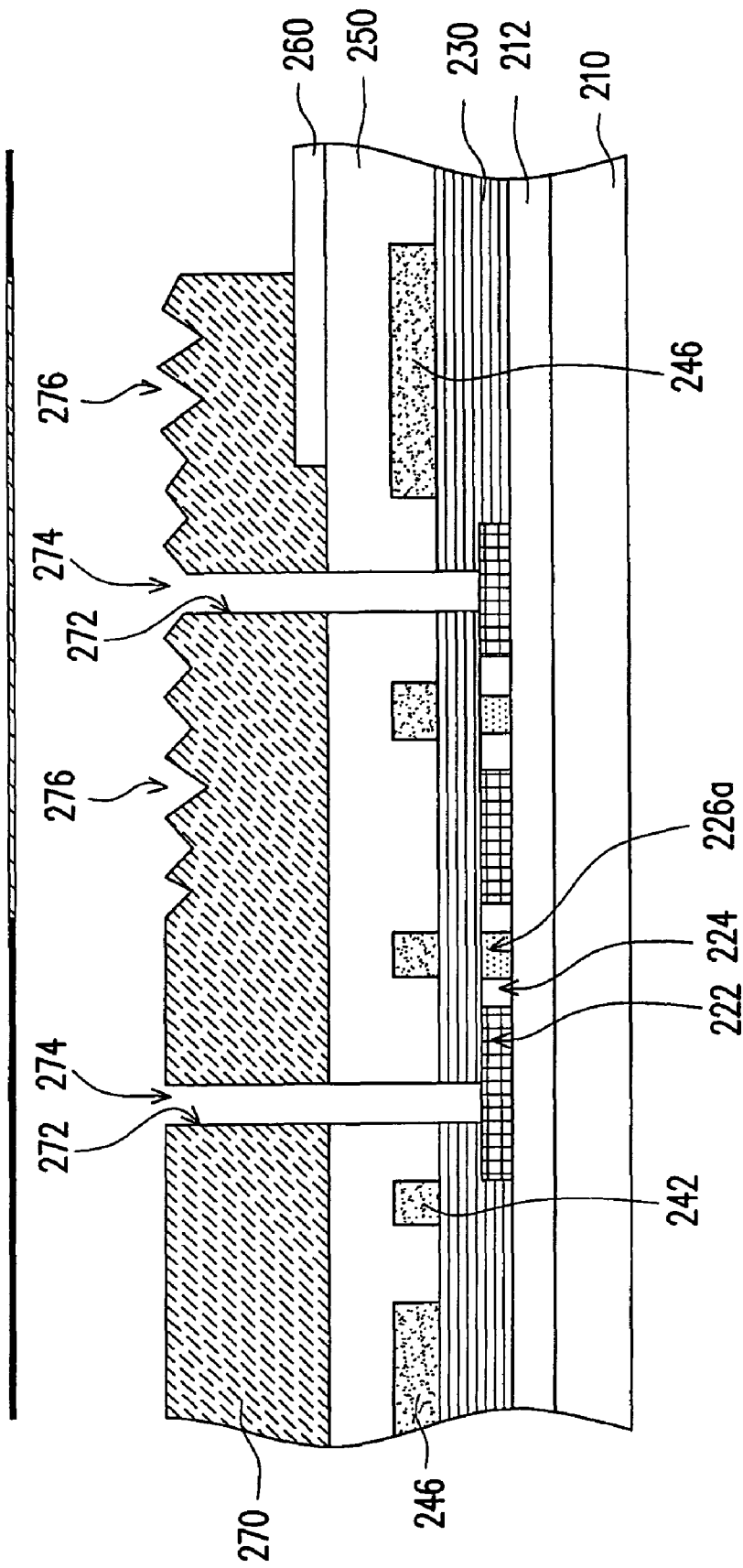

Then, please refer to FIG. 2F and FIG. 2G sequentially. A passivation layer 270 is formed on a portion of the dielectric layer 250 to expose the transparent electrodes 260, and the gate insulator layer 230, the dielectric layer 250, and the passivation layer 270 comprise a plurality of contact windows 272 to expose a portion of the semiconductor patterns. Herein, a method for forming the passivation layer 270 is, for example, a photolithography and etching process or other suitable methods, such as screen printing, coating, inkjet, and energy source processing. In addition, the passivation layer 270 may be a single-layer structure or a multi-layer structure. A material of the passivation layer 270 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. In this embodiment, the passivation layer 270 is, for example, formed by an organic photosensitive material, photoresist, and the passivation layer 270 is also called a planar layer. However, the present invention is not limited thereto. For instance, an organic material layer (not shown) is formed all over the substrate 210 first after the aforesaid processes are completed. Then, a photolithography process is performed to pattern the organic material layer so as to form a plurality of openings 274 in the organic material layer, and an etching process is performed in corresponding openings to expose a portion of the semiconductor patterns 226, as shown in FIG. 2F, wherein the gate insulator layer 230, the dielectric layer 250, and the passivation layer 270 comprise a plurality of contact windows 272. When the photolithography process is performed to pattern the organic material layer, a plurality of bumpy regions 276 may be formed on a portion of a surface of the organic material layer or all over the surface of the organic material layer. FIG. 2G illustrates an example that the bumpy regions 276 are formed on a portion of the surface of the organic material layer. Thereby, the formation of the passivation layer 270 is completed. In other words, two times of photolithography processes may be performed to form the passivation layer 270. One time is for forming openings 274, and the other time is for forming the bumpy regions 276, i.e. two photomasks are required to sequentially perform the aforesaid photolithography processes. Moreover, in other embodiments, if the increase of reflective effect is not required, the passivation layer 270 may not comprise the bumpy regions 276 and have an even surface. Hence, the second photolithography process is not required.

The above paragraphs describe a method for forming the passivation layer 270 according to the present invention. However, the present invention does not limit the method for forming the passivation layer 270. Another method for forming the passivation layer 270 is provided as follows.

Figure 2H:
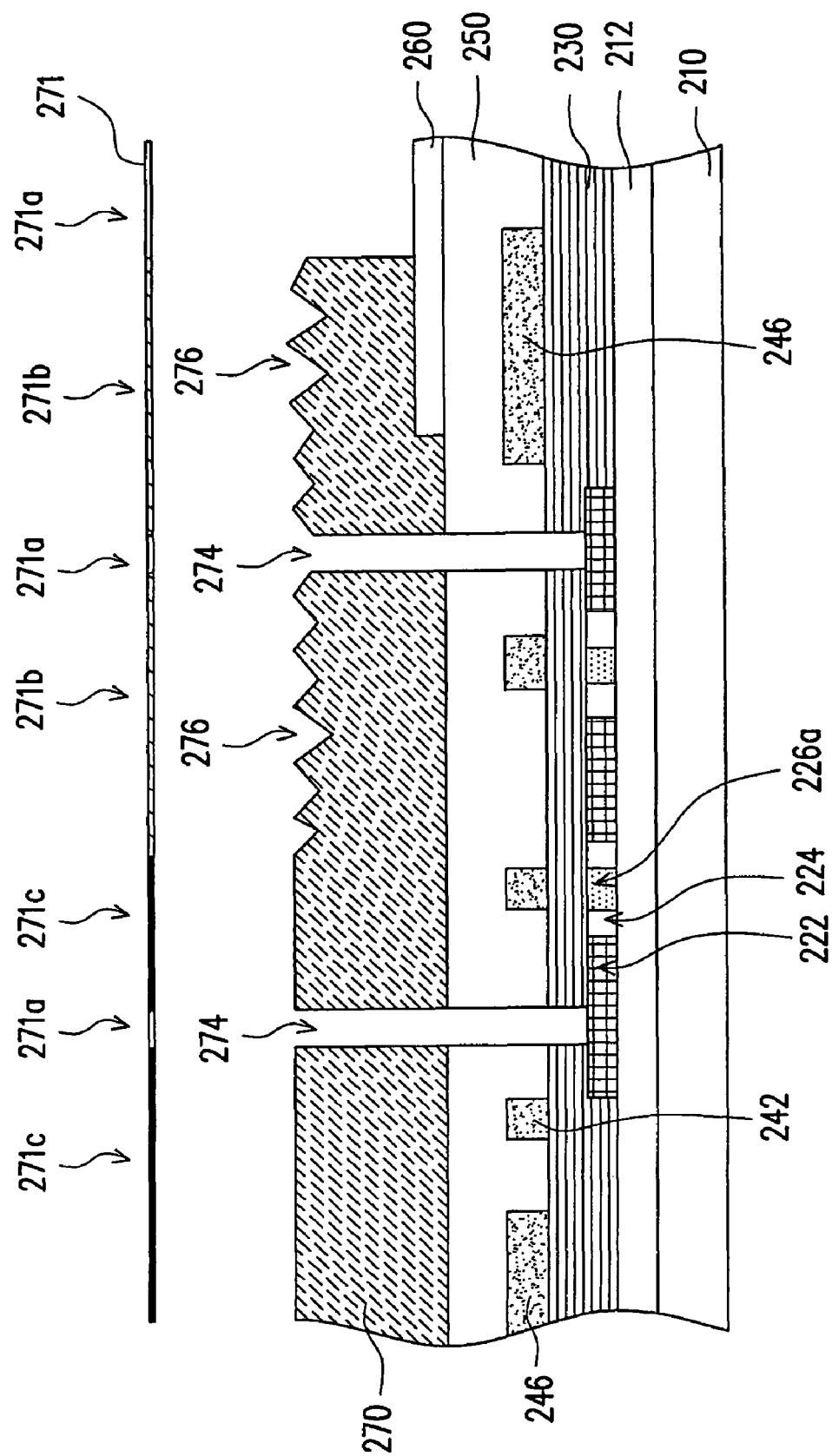
Figure 21:
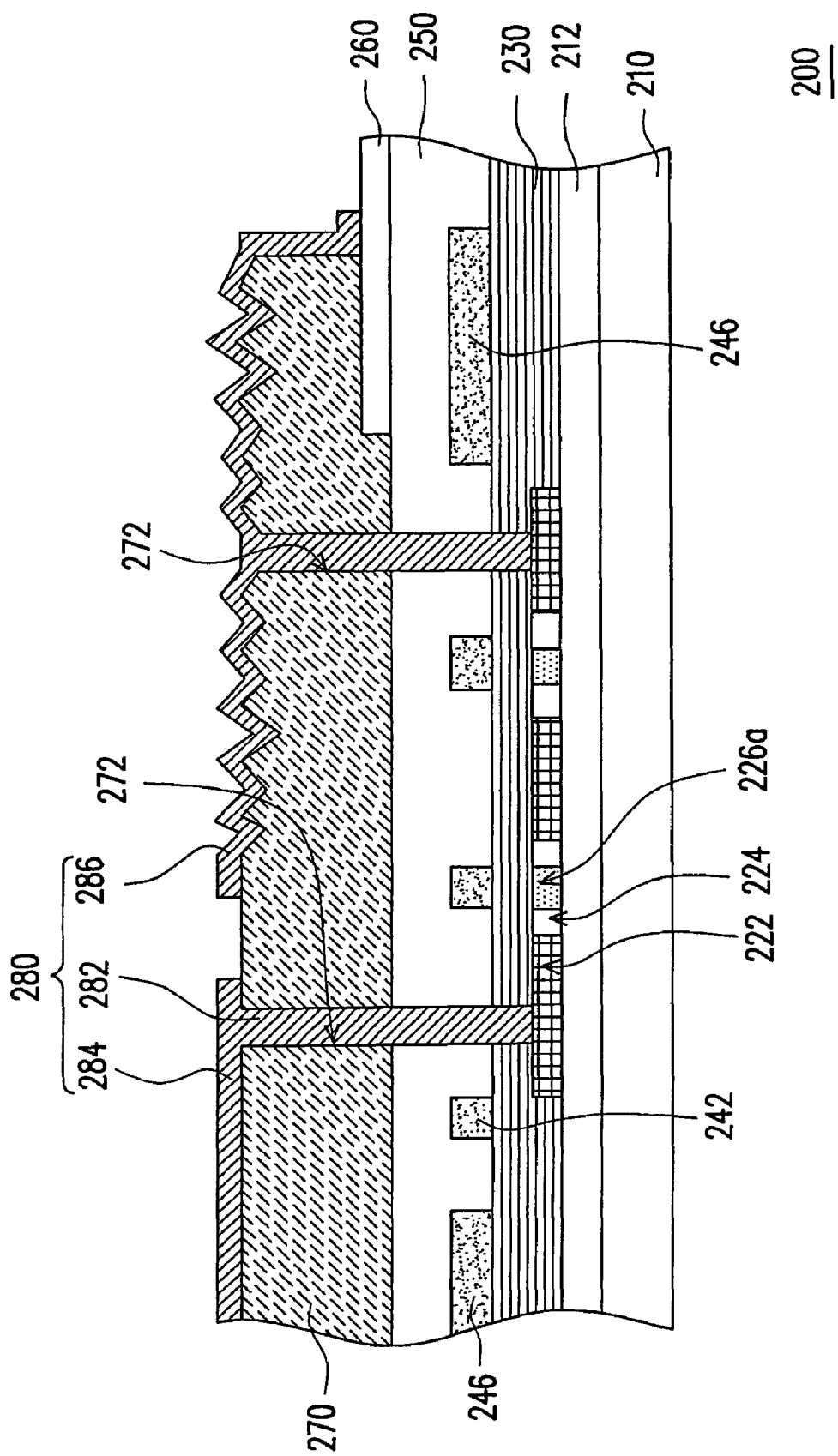

Referring to FIG. 2H, in other embodiments, the passivation layer 270 is, for example, formed by an organic material, photoresist. A method for forming the passivation layer 270 is to perform a photolithography process on an organic material layer (not shown) by using a half-tone photomask 271. For instance, after the organic material layer is formed all over the substrate 210, the half-tone photomask 271 is used to perform a photolithography and etching process so as to pattern the organic material layer. To be more specific, because the half-tone photomask 271 comprises a transparent region 271a, a half-tone region 271b, and a light shielding region 271c, such that the patterned organic material layer comprises a plurality of openings 274 and a plurality of bumpy regions 276. Thereby, the formation of the passivation layer 270 is completed. In other words, because of the use of the half-tone photomask 271, only one time of photolithography process is required in forming the passivation layer 270. As a consequence, the time and costs consumed in fabricating the passivation layer 270 is reduced.

Next, referring to FIG. 2I, a second patterned conductive layer 280 is formed on the passivation layer 270, wherein a method for forming the second patterned conductive layer 280 is, for example, a photolithography and etching process. For instance, a conductive material layer (not shown) is formed all over the substrate 210 after the aforesaid processes are completed. Then, a photolithography and etching process is performed to pattern the conductive material layer so as to form the second patterned conductive layer 280, as shown in FIG. 2I. Moreover, the second patterned conductive layer 280 comprises a plurality of contact conductors 282 disposed in the contact windows 272, a plurality of data lines 284 electrically connected with a portion of the contact conductors 282, and a plurality of reflective electrodes 286 electrically connected with corresponding transparent electrodes 260 respectively. A portion of the common electrodes 246 is disposed under the second patterned conductive layer 280. Certainly, the aforesaid method for forming the second patterned conductive layer 280 is merely one of the examples, and the present invention is not limited thereto. Other suitable methods, such as screen printing, coating, inkjet, and energy source processing, may also be applied in forming the second patterned conductive layer 280. In addition, the second patterned conductive layer 280 may be a single-layer structure or a multi-layer structure. A material of the second patterned conductive layer 280 is, for example, gold, silver, copper, tin, lead, hafnium, tungsten, molybdenum, neodymium, titanium, tantalum, aluminum, zinc, alloys of the above, metal oxides of the above, metal nitrides of the above, or a combination of the above. A lamination of molybdenum and aluminum is taken as an example in this embodiment. However, the present invention is not limited thereto.

Figure 2J:
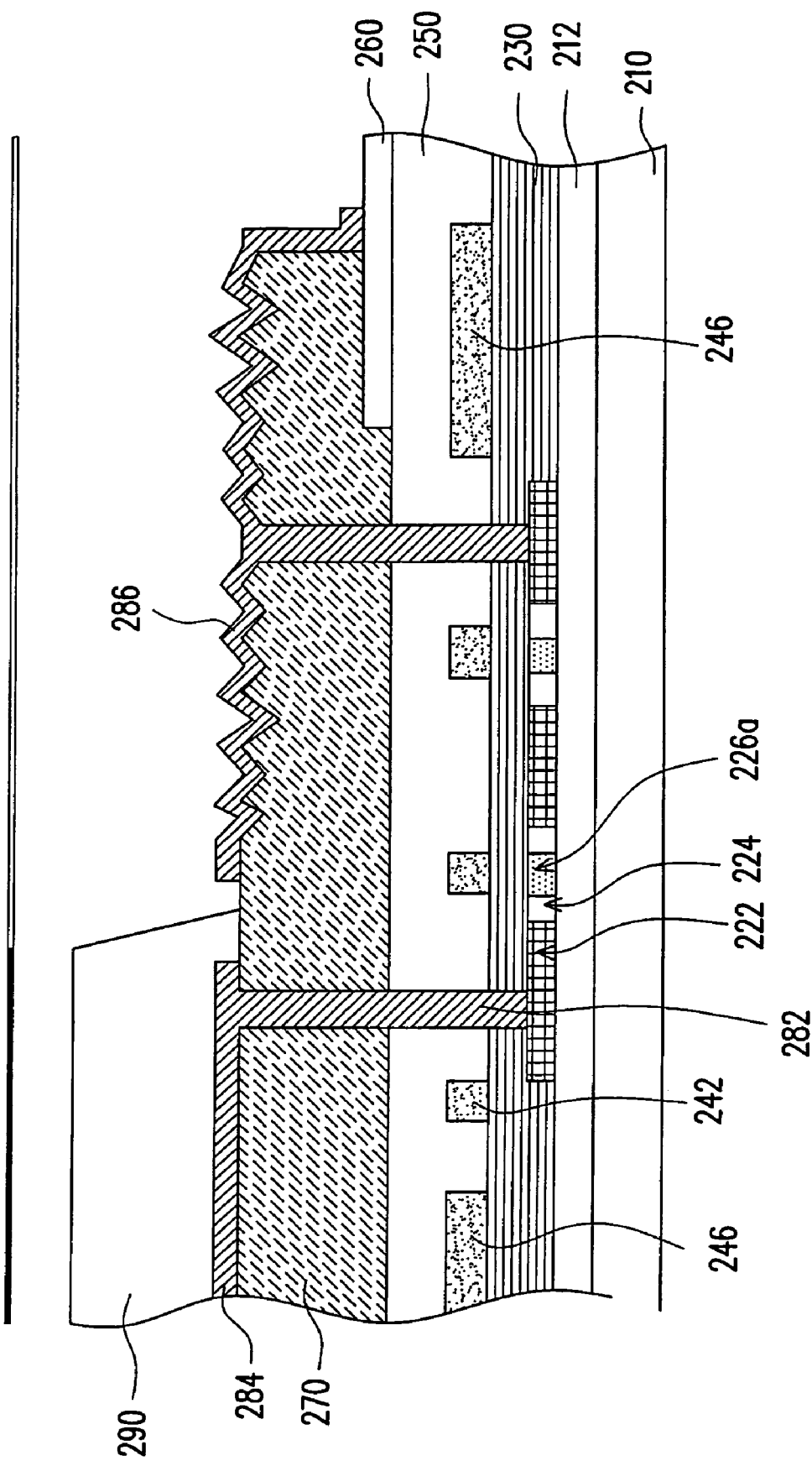
Figure 2K:
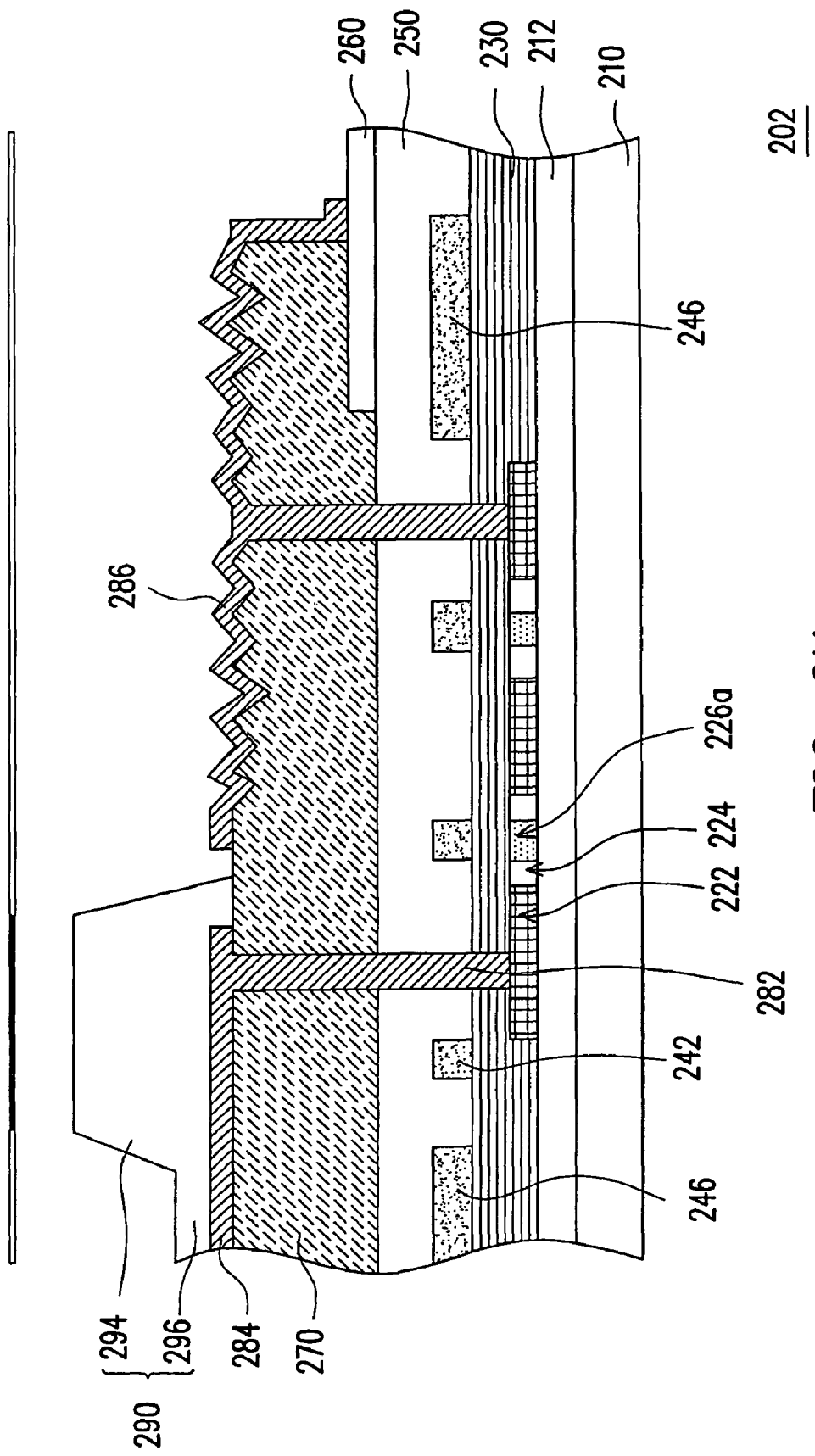

Next, sequentially referring to FIG. 2J and FIG. 2K, in another embodiment, a plurality of material pattern layers 290 is formed on a portion of the second patterned conductive layer 280, wherein a method for forming the material pattern layers 290 is, for example, a photolithography process or other suitable methods, such as screen printing, coating, inkjet, and energy source processing. In addition, the material pattern layers 290 may be single-layer structures or multi-layer structures. A material of the material pattern layers 290 is, for example, an inorganic material (e.g. silicon oxide, silicon nitride, silicon oxynitride, silicon carbide, hafnium oxide, aluminum oxide, other suitable materials, or a combination thereof), an organic material (e.g. photoresist, benzocyclobutane (BCB), cycloolefin, polyimide, polyamide, polyester, polyalcohols, polyethylene, polyphenylene, resin, polyether, polyketone, other suitable materials, or a combination thereof), or a combination of the above. In this embodiment, an organic photosensitive material, photoresist, is taken as an example and described in detail as follows. However, the present invention is not limited thereto. For instance, an organic material layer (not shown) is formed all over the active device array substrate 200. Then, a photolithography process is performed to pattern the organic material layer so as to form the material pattern layers 290 in at least one of a portion of the second patterned conductive layer 280 and a portion of the passivation layer, as shown in FIG. 2J. Hence, the material pattern layers 290 may selectively comprise at least a holding section 294 and/or at least a protective section 296. In addition, if the material pattern layers 290 having different thicknesses are required, another photolithography process may be performed on the material pattern layers 290. Thereby, the material pattern layers 290 have different thicknesses and comprise at least a holding section 294 and at least a protective section 296, as shown in FIG. 2K. Take the assembly of a display panel (not shown) as an example, if the material pattern layers 290 simultaneously comprise at least a holding section 294 and at least a protective section 296, the holding section 294 is used to maintain a gap between the active device array substrate 200 and a corresponding opposite substrate (not shown), and the holding section 294 is also called a spacer. The protective section 296 is used to protect a portion of the second patterned conductive layer 280, such as the data lines 284, disposed on the active device array substrate and prevent the second patterned conductive layer 280 from being eroded and/or scratched. In other words, the material pattern layers 290 are, for example, disposed on a portion of the data lines 284. Thereby, the fabrication of the active device array substrate 202 is completed.

Figure 2L:
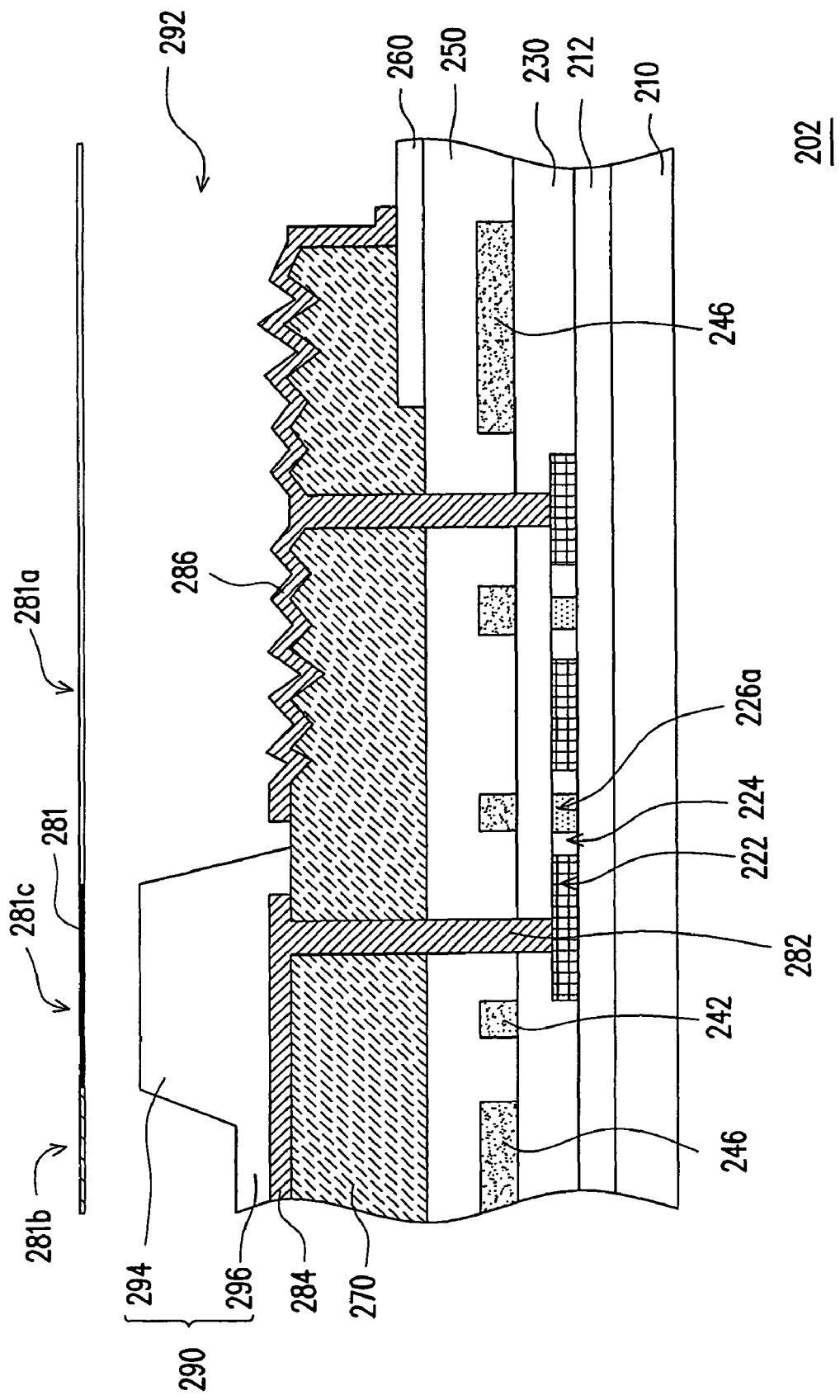

Referring to FIG. 2L, in another embodiment, a plurality of material pattern layers 290 is formed on at least one of a portion of the second patterned conductive layer 280 and a portion of the passivation layer, wherein a method for forming the material pattern layers 290 is, for example, a photolithography process or other suitable methods, such as screen printing, coating, inkjet, and energy source processing. An organic material, photoresist, is taken as an example in this embodiment. However, the present invention is not limited thereto. For instance, after the organic material layer (not shown) is formed all over the substrate 210, the half-tone photomask 281 is used to perform a photolithography process so as to pattern the photoresist material layer. To be more specific, because the half-tone photomask 281 comprises a transparent region 281a, a half-tone region 281b, and a light shielding region 281c, the patterned photoresist material layer comprises a plurality of material pattern layers 290 and a plurality of spaces 292. In other words, through using the half-tone photomask 281, the formation of the material pattern layers 290 comprising the spaces 292 only requires one time of photolithography process. Consequently, the time and costs consumed in forming the material pattern layers 290 comprising the spaces 292 are reduced.

Second Embodiment

Figure 3:
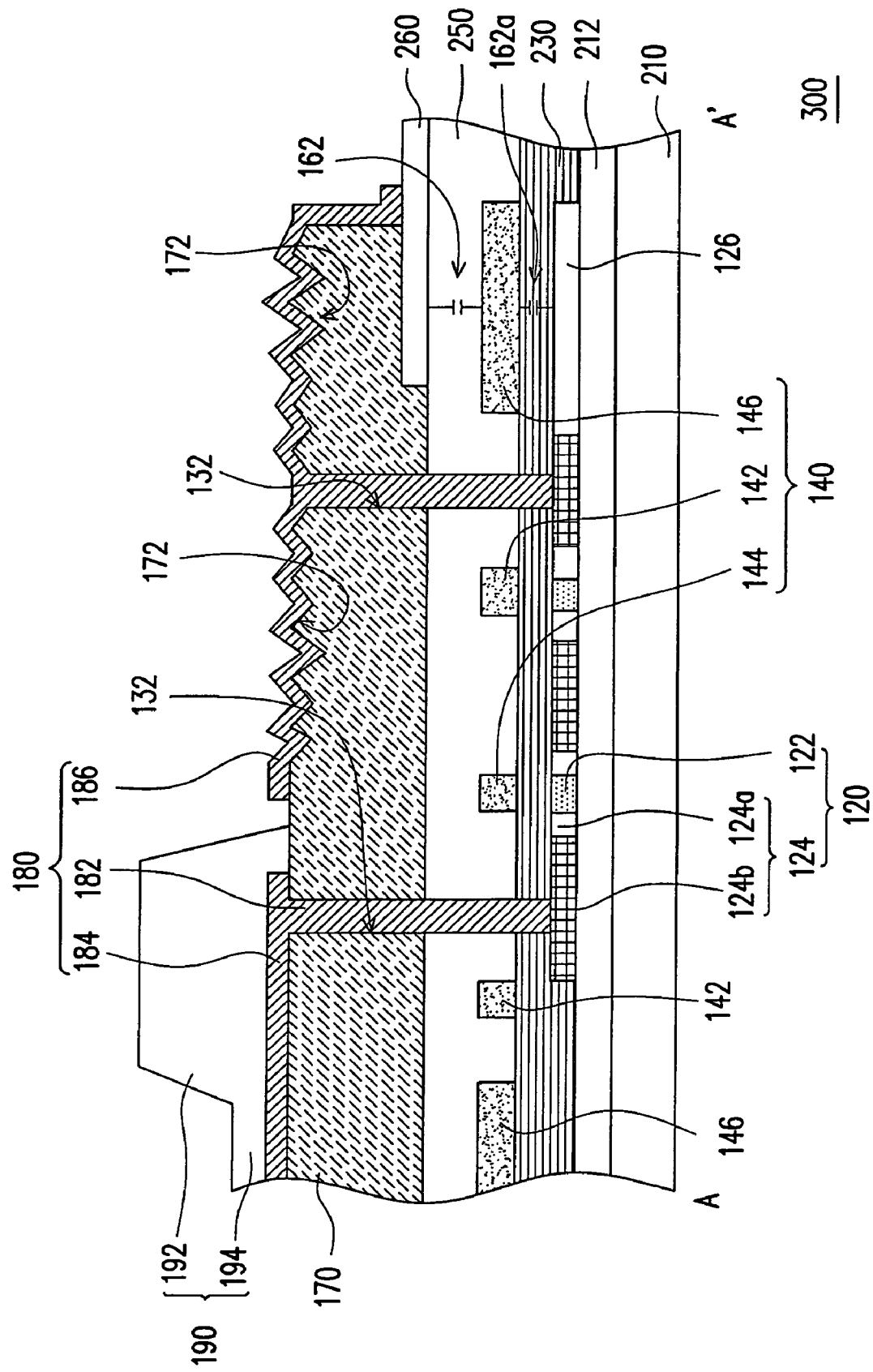
FIG. 3 is a schematic cross-sectional view illustrating another active device array substrate along the line AA' in FIG. 1A.

FIG. 3 is a schematic cross-sectional view illustrating another active device array substrate along the line AA' in FIG. 1A. An active device array substrate 300 is similar to the active device array substrate 100. Hence, the common elements thereof are indicated by the same reference numerals, and the descriptions of previously-mentioned structures are not repeated hereafter. The difference between the two active device array substrates lies in that the semiconductor patterns 120 of the active device array substrate 300 further comprise at least a capacitance electrode region 126. The capacitance electrode region 126 is connected with one of the heavily doped regions 124b and disposed under corresponding common electrodes 146.

In an embodiment of the present invention, the capacitance electrode region 126 may be formed by a heavily doped semiconductor, an undoped semiconductor, or a lightly doped semiconductor. Certainly, the capacitance electrode region 126 may also be formed by a semiconductor comprising an alternate arrangement of at least two of at least a heavily doped region, at least an undoped region, and at least a lightly doped region.

More specifically, the semiconductor patterns 120 comprise the capacitance electrode region 126. Therefore, when the active device array substrate 300 is driven, a portion of the transparent electrodes 160 extends above one of the common electrodes 146 to couple with the corresponding common electrode 146 and form a capacitor 162, and further the capacitance electrode region 126 forms another capacitor 162a with a corresponding common electrode 146 above. In other words, the active device array substrate 300 has a better storage capacitance value.

It needs to be further described that the bumpy regions 172 and 276 in the aforesaid embodiments are disposed in the passivation layers 170 and 270, or formed by another layer (not shown) on the passivation layers 170 and 270, for example. However, the present invention is not limited thereto. A photolithography and etching process may be performed to form the bumpy regions 172 and 276 on a portion of the reflective electrodes 186 and 286, or the bumpy regions 172 and 276 may be formed on a portion of the dielectric layers 150 and 250 first, and the passivation layers 170 and 270 are then formed thereon so that a portion of a surface of the passivation layers 170 and 270 may comprise similar bumpy regions 172 and 276. Moreover, another layer (not shown) may be applied on a portion of the dielectric layers 150 and 250 to form the bumpy regions 172 and 276, and the passivation layers 170 and 270 are then formed thereon so that a portion of the surface of the passivation layers 170 and 270 may comprise similar bumpy regions 172 and 276. The bumpy regions 172 and 276 may also be formed on a portion of the gate insulator layers 130 and 230, and the layers required are then sequentially formed thereon so that a portion of the surface of the passivation layers 170 and 270 may comprise similar bumpy regions 172 and 276. Furthermore, another layer (not shown) may be applied on a portion of the gate insulator layers 130 and 230 to form the bumpy regions 172 and 276, and then the layers required are sequentially formed thereon so that a portion of the surface of the passivation layers 170 and 270 may comprise similar bumpy regions 172 and 276. In addition, another layer (not shown) may be applied on a portion of the substrate to form the bumpy regions 172 and 276, and then the layers required are sequentially formed thereon so that a portion of the surface of the passivation layers 170 and 270 may comprise similar bumpy regions 172 and 276. The bumpy regions 172 and 276 may also be formed on a portion of the substrate, and then the layers required are sequentially formed thereon so that a portion of the surface of the passivation layers 170 and 270 may comprise similar bumpy regions 172 and 276. Herein, a material of the aforesaid another layer may be the same as a material of the gate insulator layers 130 and 230, the dielectric layers 150 and 250, the passivation layers 170 and 270, the buffer layers 112 and 212, or the material pattern layers 190 and 290, and substantially the same as or different from the above materials. Preferably, the aforesaid another layer is formed by an organic material. However, the present invention is not limited thereto.

In addition, although two gate electrodes are taken as an example in the above embodiment, the present invention is not limited thereto. At least one gate electrode (e.g. one gate electrode, three gate electrodes, two gate electrodes, and four gate electrodes) may be disposed depending on the design. Herein, when a plurality of gate electrodes is disposed, the doped regions therein may be N-type doped regions, P-type doped regions, or a combination of the above. Certainly, when only one gate electrodes is disposed, a doped region therein may be an N-type doped region, a P-type doped region, or a combination of the above.

Figure 4:
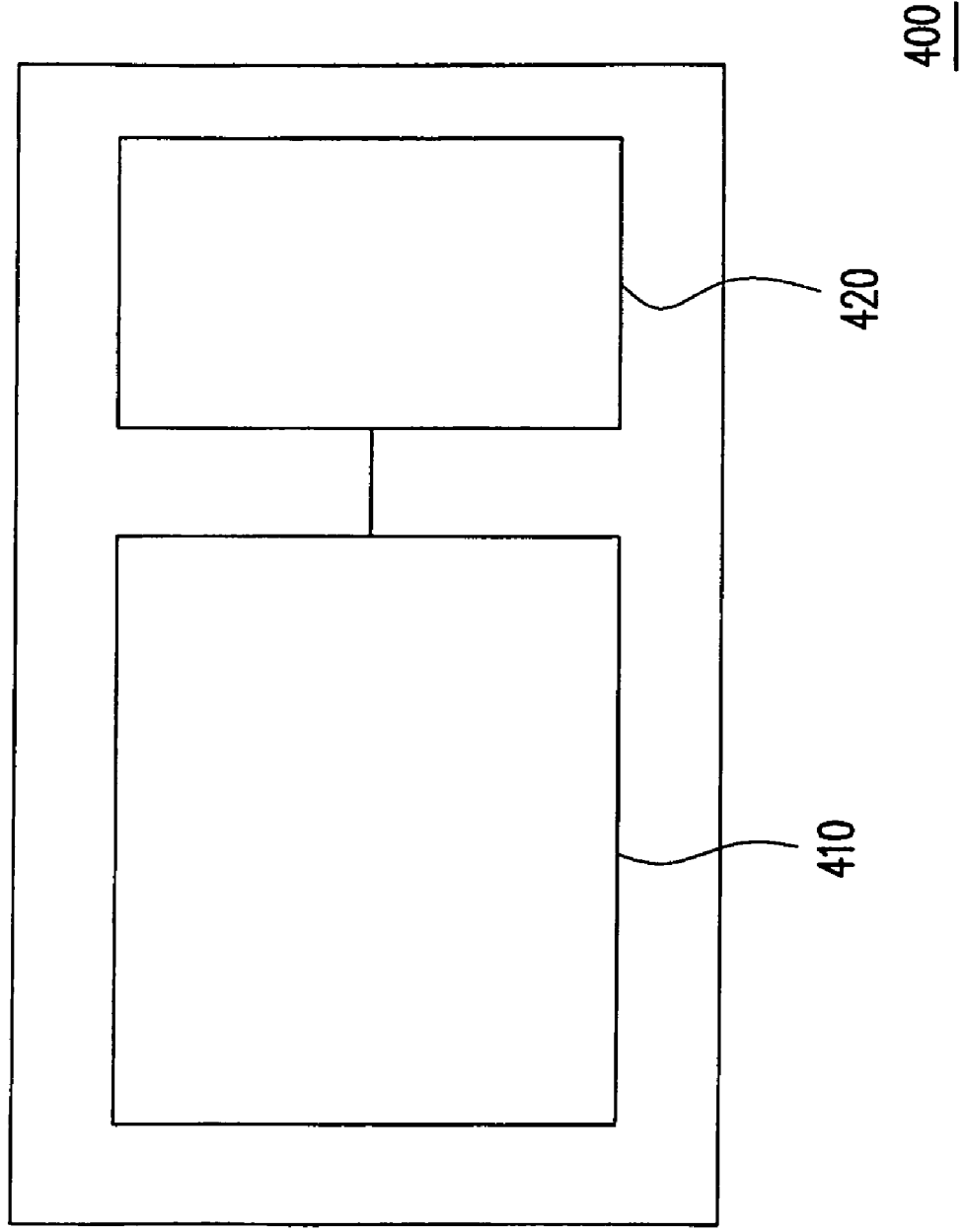
FIG. 4 schematically illustrates an electro-optical apparatus according to an embodiment of the present invention.

Furthermore, FIG. 4 schematically illustrates an electro-optical apparatus according to an embodiment of the present invention. Referring to FIG. 4, an electro-optical apparatus 400 comprises a display panel 410 and an electronic device 420 electrically connected with the display panel 410. The display panel 410 comprises one of the active device array substrates 100, 200, 202, and 300 in the aforesaid embodiments. Because the active device array substrates have the advantages of simple fabricating processes and lower production time and costs, the costs for fabricating the electro-optical apparatus 400 is reduced.

To be more specific, according to display modes, designs of layers, and display media, the display panel 410 is referred to a liquid crystal display panel, e.g. a transmissive display panel, a transflective display panel, a reflective display panel, a color-filter-on-array display panel, an array-on-color-filter display panel, a vertical alignment (VA) display panel, an in plane switch (IPS) display panel, a multi-domain vertical alignment (MVA) display panel, a twist nematic (TN) display panel, a super twist nematic (STN) display panel, a pattern vertical alignment (PVA) display panel, a super-pattern vertical alignment (S-PVA) display panel, an advanced super view (ASV) display panel, a fringe-field switching (FFS) display panel, a continuous pinwheel alignment (CPA) display panel, an axially symmetric aligned microcell (ASM) display panel, an optically compensated bend (OCB) display panel, a super-in plane switch (S-IPS) display panel, an advanced super-in plane switch (AS-IPS) display panel, an ultra fringe-field switching (UFFS) display panel, a polymer sustained alignment (PSA) display panel, a dual-view display panel, a triple-view display panel, a three-dimensional display panel, any other display panels, or a combination of the above, which is also called a non-self-illuminating display panel. If an electroluminescent material is used as the display medium, the display panel is called an electroluminescent display panel (e.g. a phosphor electroluminescent display panel, a fluorescent electroluminescent display panel, or a combination thereof), which is also called a self-illuminating display panel. The electroluminescent material may be an organic material, an inorganic material, or a combination thereof. Furthermore, molecules of the aforesaid materials comprise small molecules, high polymers, or a combination thereof. If the display media comprise both a liquid crystal material and an electroluminescent material, the display panel is called a hybrid display panel or a semi-self-illuminating display panel.

In addition, the electronic device 420 comprises a control device, an operating device, a processing device, an input device, a memory device, a driving device, a light emitting device, a protective device, a sensing device, a detecting device, devices having other functions, or a combination thereof. In general, applications of the electro-optical apparatus 400 comprise a portable product (e.g. a mobile phone, a camcorder, a camera, a laptop, a game player, a watch, a music player, an E-mail receiver and sender, a map navigator, a digital photo, or similar products), an audio-video product (e.g. an audio-video player or similar products), a screen, a television, a bulletin, a panel in a projector, and so on.

In addition, it is noted that the top-view patterns of the common electrodes 146 and 246 of the active device array substrates 100, 200, 202, 300 comprise linear shape, L shape, U shape, H shape, ring shape, or a combination thereof. Preferably, circular shape is taken as an example in the aforesaid embodiment, and the common electrodes of circular shape are also called common conductive circles. However, the present invention is not limited thereto.

In view of the above, the active device array substrates according to the present invention have at least the following advantages. First, conventional processes for fabricating an active device array substrate is shorten through using the half-tone photomask. Moreover, the dielectric layer and the passivation layer are disposed between the first patterned conductive layer and the second patterned conductive layer. Thereby, crosstalk between the data lines and a portion of the common electrodes is reduced when the active device array substrate is driven. Furthermore, the passivation layer is disposed between the transparent electrodes and the second patterned conductive layer. Consequently, crosstalk between the data lines and the transparent electrodes is reduced to decrease signal interference. In other words, a structure, which comprises the data lines, the passivation layer, the transparent electrodes, the dielectric layer, and the common electrodes from top to bottom, has an effect of reducing crosstalk. Furthermore, the pixel capacitor formed by the common electrodes and a portion of the transparent electrodes is disposed under the data lines. Consequently, the area used is reduced and an aperture ratio of the active device array substrate is increased to enhance display quality.

In addition, the material pattern layers disposed on the active device array substrate provide a function of protecting the data lines. Further to the above, because the capacitance electrode region is disposed under a portion of the transparent electrodes, the active device array substrate has a better storage capacitance value when driven. Hence, the active device array substrate of the present invention has the advantages of better display quality, simpler fabricating processes, and lower production costs, when applied in the aforesaid electro-optical apparatus.

Although the present invention has been disclosed by the above embodiments, they are not intended to limit the present invention. Anybody skilled in the art may make some modifications and alterations without departing from the spirit and scope of the present invention. Therefore, the protection range of the present invention falls in the appended claims.

What is claimed is:

1. An active device array substrate, comprising:
a substrate;
a plurality of semiconductor patterns disposed on the substrate;
a gate insulator layer disposed on the substrate to cover the semiconductor patterns;
a first patterned conductive layer disposed on the gate insulator layer, the first patterned conductive layer comprising a plurality of scan lines, a plurality of gate electrodes disposed on each of the semiconductor patterns and connected with the scan lines, and a plurality of common electrodes disposed between the scan lines;
a dielectric layer disposed on the gate insulator layer to cover the first patterned conductive layer;
a plurality of transparent electrodes disposed on the dielectric layer;
a passivation layer disposed on a portion of the dielectric layer so as to expose the transparent electrodes, wherein the gate insulator layer, the dielectric layer, and the passivation layer comprise a plurality of contact windows to expose the semiconductor patterns;
a second patterned conductive layer disposed on the passivation layer, wherein the second patterned conductive layer comprises a plurality of contact conductors disposed in the contact windows, a plurality of data lines electrically connected with a portion of the contact conductors, and a plurality of reflective electrodes electrically connected with corresponding transparent electrodes respectively, and a portion of the common electrodes is disposed under the second patterned conductive layer; and
a plurality of material pattern layers disposed on the second patterned conductive layer, wherein the material pattern layers and the second patterned conductive layer are different.

2. The active device array substrate of claim 1, wherein each of the semiconductor patterns comprises at least a channel region and at least a doped region disposed on two sides of the channel region.

3. The active device array substrate of claim 2, wherein each of the doped regions comprises a lightly doped region and a heavily doped region, and the lightly doped region is connected between the heavily doped region and the channel region.

4. The active device array substrate of claim 3, wherein each of the semiconductor patterns further comprises a capacitance electrode region which is connected with one of the heavily doped regions and disposed under a corresponding common electrode.

5. The active device array substrate of claim 4, wherein the capacitance electrode regions comprise at least one of a heavily doped semiconductor and an undoped semiconductor.

6. The active device array substrate of claim 1, wherein the passivation layer comprises a plurality of bumpy regions.

7. The active device array substrate of claim 6, wherein each of the reflective electrodes is disposed above corresponding bumpy regions respectively.

8. The active device array substrate of claim 7, wherein each of the reflective electrodes respectively extends above corresponding transparent electrodes from corresponding bumpy regions, so as to overlap a portion of corresponding transparent electrodes.

9. The active device array substrate of claim 1, wherein the material pattern layers are disposed on the data lines.

10. The active device array substrate of claim 1, wherein each of the material pattern layers comprises at least a holding section and at least a protective section, and a thickness of the holding section is substantially greater than a thickness of the protective section.

11. The active device array substrate of claim 1, further comprising a buffer layer, wherein the buffer layer is disposed on the substrate and disposed between the substrate and the semiconductor patterns.

12. The active device array substrate of claim 1, wherein each of the transparent electrodes extends above one of the common electrodes to couple with corresponding common electrodes as a capacitor.

13. A method for fabricating an active device array substrate, comprising:
forming a plurality of semiconductor material layers on a substrate;
forming a gate insulator layer on the substrate to cover the semiconductor material layers;
forming a first patterned conductive layer on the gate insulator layer, the first patterned conductive layer comprising a plurality of scan lines, a plurality of gate electrodes disposed on each of the semiconductor material layers and connected with the scan lines, and a plurality of common electrodes disposed between the scan lines;
performing an ion doping process on the semiconductor material layer to form a plurality of semiconductor patterns, wherein each of the semiconductor patterns comprises at least a channel region and at least a doped region disposed on two sides of the channel region;
forming a dielectric layer on the gate insulator layer to cover the first patterned conductive layer;
forming a plurality of transparent electrodes on the dielectric layer;
forming a passivation layer on a portion of the dielectric layer to expose the transparent electrodes, wherein the gate insulator layer, the dielectric layer, and the passivation layer comprise a plurality of contact windows to expose the semiconductor patterns;
forming a second patterned conductive layer on the passivation layer, wherein the second patterned conductive layer comprises a plurality of contact conductors disposed in the contact windows, a plurality of data lines electrically connected with a portion of the contact conductors, and a plurality of reflective electrodes electrically connected with corresponding transparent electrodes respectively, and a portion of the common electrodes is disposed under the second patterned conductive layer; and
forming a plurality of material pattern layers on the second patterned conductive layer, wherein the material pattern layers and the second patterned conductive layer are different.

14. The method of claim 13, wherein the formation of the semiconductor patterns comprises:
forming a plurality of heavily doped regions in the semiconductor material layer; and using the first patterned conductive layer as a mask to form a channel region and a plurality of lightly doped regions respectively connected between the heavily doped regions and the channel region in the semiconductor material layer.

15. The method of claim 14, further comprising forming a capacitance electrode region in each of the semiconductor patterns, wherein the capacitance electrode region is connected with one of the heavily doped regions and disposed under corresponding common electrodes.

16. The method of claim 13, wherein the formation of the passivation layer comprises:
    forming an organic material layer on the dielectric layer; and
    forming a plurality of openings in the organic material layer, and forming a plurality of bumpy regions on a surface of the organic material layer.

17. The method of claim 13, further comprising forming a buffer layer on the substrate, wherein the buffer layer is disposed between the substrate and the semiconductor patterns.

18. An electro-optical apparatus, comprising the active device array substrate of claim 1.

19. A method for fabricating the electro-optical apparatus, comprising the method for fabricating the active device array substrate of claim 13.

20. The active device array substrate of claim 1, wherein a top-view pattern of the common electrodes comprises linear shape, L shape, U shape, H shape, ring shape, or a combination thereof.

21. An active device array substrate, comprising:
    a substrate;
    a plurality of semiconductor patterns disposed on the substrate;
    a gate insulator layer disposed on the substrate to cover the semiconductor patterns;
    a first patterned conductive layer disposed on the gate insulator layer, the first patterned conductive layer comprising a plurality of scan lines, a plurality of gate electrodes disposed on each of the semiconductor patterns and connected with the scan lines, and a plurality of common electrodes disposed between the scan lines;
    a dielectric layer disposed on the gate insulator layer to cover the first patterned conductive layer;
    a plurality of transparent electrodes disposed on the dielectric layer;
    a passivation layer disposed on a portion of the dielectric layer so as to expose the transparent electrodes, wherein the gate insulator layer, the dielectric layer, and the passivation layer comprise a plurality of contact windows to expose the semiconductor patterns; and
    a second patterned conductive layer disposed on the passivation layer, wherein the second patterned conductive layer comprises a plurality of contact conductors disposed in the contact windows, a plurality of data lines electrically connected with a portion of the contact conductors, and a plurality of reflective electrodes electrically connected with corresponding transparent electrodes respectively, and a portion of the common electrodes is disposed under the second patterned conductive layer, each of the transparent electrodes extends above one of the common electrodes to couple with corresponding common electrodes as a capacitor, and the capacitor is disposed under corresponding data line.

22. The active device array substrate of claim 21, wherein each of the semiconductor patterns comprises at least a channel region and at least a doped region disposed on two sides of the channel region.

23. The active device array substrate of claim 22, wherein each of the doped regions comprises a lightly doped region and a heavily doped region, and the lightly doped region is connected between the heavily doped region and the channel region.

24. The active device array substrate of claim 23, wherein each of the semiconductor patterns further comprises a capacitance electrode region which is connected with one of the heavily doped regions and disposed under a corresponding common electrode.

25. The active device array substrate of claim 24, wherein the capacitance electrode regions comprise at least one of a heavily doped semiconductor and an undoped semiconductor.

26. The active device array substrate of claim 21, wherein the passivation layer comprises a plurality of bumpy regions.

27. The active device array substrate of claim 26, wherein each of the reflective electrodes is disposed above corresponding bumpy regions respectively.

28. The active device array substrate of claim 27, wherein each of the reflective electrodes respectively extends above corresponding transparent electrodes from corresponding bumpy regions, so as to overlap a portion of corresponding transparent electrodes.

29. The active device array substrate of claim 21, further comprising a plurality of material pattern layers disposed on the second patterned conductive layer.

30. The active device array substrate of claim 29, wherein the material pattern layers are disposed on the data lines.

31. The active device array substrate of claim 29, wherein each of the material pattern layers comprises at least a holding section and at least a protective section, and a thickness of the holding section is substantially greater than a thickness of the protective section.

32. The active device array substrate of claim 21, further comprising a buffer layer, wherein the buffer layer is disposed on the substrate and disposed between the substrate and the semiconductor patterns.

33. The active device array substrate of claim 21, wherein a top-view pattern of the common electrodes comprises linear shape, L shape, U shape, H shape, ring shape, or a combination thereof.

34. An electro-optical apparatus, comprising the active device array substrate of claim 21.

* * * * *